(12) United States Patent
Tomishima et al.

(10) Patent No.: US 6,885,235 B2
(45) Date of Patent: Apr. 26, 2005

(54) SEMICONDUCTOR INTEGRATED CIRCUIT DEVICE WITH INTERNAL POWER SUPPLY POTENTIAL GENERATION CIRCUIT

(75) Inventors: Shigeki Tomishima, Hyogo (JP); Mitsutaka Niiro, Hyogo (JP); Masanao Maruta, Hyogo (JP); Hiroshi Kato, Hyogo (JP); Masatoshi Ishikawa, Hyogo (JP); Takaharu Tsuji, Hyogo (JP); Hideto Hidaka, Hyogo (JP); Hiroaki Tanizaki, Hyogo (JP); Tsukasa Ooishi, Hyogo (JP)

(73) Assignees: Renesas Technology Corp., Tokyo (JP); Mitsubishi Electric Engineering Company Limited, Tokyo (JP)

( * ) Notice: Subject to any disclaimer, the term of this patent is extended or adjusted under 35 U.S.C. 154(b) by 425 days.

(21) Appl. No.: 10/095,080

(22) Filed: Mar. 12, 2002

(65) Prior Publication Data

US 2003/0007296 A1 Jan. 9, 2003

(30) Foreign Application Priority Data

Jul. 6, 2001 (JP) ..................................... 2001-206291

(51) Int. Cl.$^7$ ............................................. G05F 3/04
(52) U.S. Cl. ..................................... 327/538; 323/312
(58) Field of Search ................................ 323/312, 315, 323/316; 365/226, 227; 327/530, 534, 535, 538, 540, 541, 544–546

(56) References Cited

U.S. PATENT DOCUMENTS 5,396,113 A * 3/1995 Park et al. .................. 327/543
5,592,121 A * 1/1997 Jung et al. .................. 327/541
5,612,920 A * 3/1997 Tomishima ................. 365/226
5,886,569 A * 3/1999 Mitsuishi .................... 327/540
5,946,242 A * 8/1999 Cho et al. ............... 365/189.06
6,281,745 B1 * 8/2001 Kim et al. ................... 327/541
6,492,850 B2 * 12/2002 Kato et al. ................... 327/143
6,636,451 B2 * 10/2003 Park et al. .................. 365/226
6,768,370 B2 * 7/2004 Takahashi et al. .......... 327/540

FOREIGN PATENT DOCUMENTS

| JP | 2-101694 | 4/1990 |
| JP | 5-314769 | 11/1993 |
| JP | 6-266452 | 9/1994 |

* cited by examiner

Primary Examiner—Matthew V. Nguyen
(74) Attorney, Agent, or Firm—McDermott Will & Emery LLP

(57) ABSTRACT

An internal power supply potential generation circuit includes an overcharge prevention circuit connected to an internal power supply node. The overcharge prevention circuit includes a circuit outputting a signal to be determined that is determined by an internal power supply potential, a differential amplification circuit amplifying a difference in potential between the signal to be determined and a reference potential for output to a node as a signal indicating that current should be drawn, and a current draw circuit drawing current from the internal power supply node in response to the signal indicating that current should be drawn. Thus the semiconductor integrated circuit device of interest can provide a steady internal power supply potential.

18 Claims, 26 Drawing Sheets

SEMICONDUCTOR INTEGRATED CIRCUIT DEVICE WITH INTERNAL POWER SUPPLY POTENTIAL GENERATION CIRCUIT

BACKGROUND OF THE INVENTION

1. Field of the Invention

The present invention relates generally to semiconductor integrated circuits and particularly to semiconductor integrated circuit devices testable and including an internal power supply potential generation circuit.

2. Description of the Background Art

In recent years there is a demand for semiconductor integrated circuit devices with larger capacities and semiconductor integrated circuit devices have accordingly been increasingly micro-fabricated. This, however, results in a semiconductor integrated circuit device having internal circuitry with a reduced breakdown voltage. Accordingly, the semiconductor integrated circuit device uses an internal power supply potential obtained by down-converting an external power supply potential. The external power supply potential is down-converted to the internal power supply potential in the semiconductor integrated circuit device by an internal power supply potential generation circuit. Thus the internal power supply potential generation circuit is also referred to as a voltage down converter (VDC).

A VDC generates an internal power supply potential which is used in a semiconductor integrated circuit device by a plurality of internal circuits. As such if the internal power supply potential drops below a predetermined potential the plurality of internal circuits cannot operate at a predetermined rate of operation.

In contrast, if the internal power supply potential exceeds a predetermined potential the plurality of internal circuits may be destroyed.

Thus the VDC is required to reduce variation of the internal power supply potential and thus supply a steady internal power supply potential.

FIG. 29 is a circuit diagram showing a configuration of a conventional VDC.

As shown in FIG. 29, a VDC500 includes a differential amplification circuit 530, a current supply transistor QD1, an internal power supply node 520, a decouple capacitor 545, and a load 550.

Differential amplification circuit 530 includes P channel MOS transistors QP1, QP2, and N channel MOS transistors QN1, QN2, QN3.

Differential amplification circuit 530 amplifies a difference in potential between an internal power supply potential int.Vdd and a reference potential Vref and outputs the amplified difference in potential to current supply transistor QD1 at the gate. In response to the output of differential amplification circuit 530, current supply transistor QD1 passes a supply current Isup from an external power supply node 510 to an internal power supply node 520. Decouple capacitor 545 reduces variation of a level in potential of the internal power supply node. Load 550 receives internal power supply potential int.Vdd from internal power supply node 520 and consumes a load current Iload.

When internal power supply potential int.Vdd drops below reference potential Vref, current supply transistor QD1 supplies internal power supply node 520 with supply current Isup. In contrast, if internal power supply potential int.Vdd exceeds reference potential Vref, current supply transistor QD1 is turned off. Thus, supply current Isup is not supplied to internal power supply node 520.

As a result, VDC500 operates to maintain internal power supply potential int.Vdd of the level of reference potential Vref.

Load current Iload consumed by load 550 will now be described.

FIG. 30 is timing plots representing an operation of VDC500 corresponding to one example of load current Iload.

FIG. 30 represents load current Iload having a current waveform observed when load 500 continuously consumes a small amount of current. Such a current waveform is observed in a dynamic random access memory (DRAM) for example at a signal buffer.

With reference to FIG. 30, when a control signal ACT has an active state the VDC is actuated. If by load current Iload internal power supply potential int.Vdd is reduced, decouple capacitor 545 operates to reduce the reduction of internal power supply potential int.Vdd. Furthermore, supply current Isup is supplied to internal power supply node 520. This prevents internal power supply potential int.Vdd from significantly dropping from reference potential Vref and thus prevents load 550 from erroneous operation.

FIG. 31 is timing plots representing an operation of VDC500 corresponding to another example of load current Iload.

FIG. 31 represents load current Iload having a current waveform observed when load 500 consumes a large amount of current. Such a current waveform is observed in a DRAM for example at a sense amplifier.

As shown in FIG. 31, when control signal ACT has an active state, the VDC is activated. When because of a large amount of load current Iload internal power supply potential int.Vdd significantly drops, supply current Isup is supplied to internal power supply node 520. There is a case, however, where supply current Isup cannot prevent the reduction of internal power supply potential int.Vdd and internal power supply potential int.Vdd thus has a large drop $\Delta V2$. Such a reduction of internal power supply potential int.Vdd results in load 550 operating at a reduced rate.

Furthermore, decouple capacitor 545 operates to prevent the reduction of internal power supply potential int.Vdd, although to prevent the reduction of internal power supply potential int.Vdd attributed to a large amount of load current Iload, decouple capacitor 545 is required to have a capacitance accordingly increased. Increasing the capacitance of decouple capacitor 54 results in increasing the cheap area.

As a technique used to provide a steady internal power supply voltage if a large amount of load current Iload is generated, as shown in FIG. 31, a VDC including a boost circuit is used.

The boost circuit supplies current to internal power supply node 520 previously before load current Iload is generated.

The VDC including the boost circuit, however, can disadvantageously be overcharged or undercharged because of variation of external power supply potential ext.Vdd, variation of the fabrication process, and the like. Furthermore, for a semiconductor integrated circuit device having a test mode, overcharge can disadvantageously occur in conducting a test when the boost circuit operates.

SUMMARY OF THE INVENTION

The present invention contemplates a semiconductor integrated circuit device capable of providing a steady internal power supply potential.

The present invention provides a semiconductor integrated circuit device including: a load circuit effecting an operation in response to a control signal activated; an internal power supply node connected to the load circuit; an external power supply node supplying an external power supply potential; an internal power supply generation circuit converting the external power supply potential to an internal power supply potential for supply to the internal power supply node; and an overcharge prevention circuit preventing the internal power supply node from being overcharged.

Preferably the internal power supply generation circuit includes: a first differential amplification circuit amplifying a difference in potential between the internal power supply potential input to a first differential input node and a reference potential input to a second differential input node, for output to an output node; a current supply circuit supplying the internal power supply node with a current depending on a level in potential of the output node; and a compulsory current supply circuit passing a current from the external power supply node to the input power supply node regardless of the difference in potential.

Preferably the compulsory current supply circuit supplies a current to the internal power supply node for a predetermined period of time in response to the control signal activated.

Thus the internal power supply node can be free of reduction in potential and the internal power supply potential can be stabilized.

Preferably the overcharge prevention circuit reduces the internal power supply potential when the internal power supply potential is higher than a predetermined potential.

Preferably the overcharge prevention circuit includes: a second differential amplification circuit comparing the internal power supply potential with the predetermined potential and outputting a result of comparing the internal power supply potential with the predetermined potential; and a potential reduction circuit operative in response to the result to reduce the internal power supply potential.

Thus if the internal power supply node attains an unnecessarily high level in potential the level can be reduced to a predetermined potential level.

Preferably the predetermined potential is higher than the reference potential.

More preferably the semiconductor integrated circuit device further includes a decouple capacitance connected to the internal power supply node, wherein the predetermined period of time determined by the compulsory current supply circuit depends on a size of the decouple capacitance.

Thus if semiconductor integrated circuit devices of various types have different decouple capacitances the internal power supply node can have a level in potential stabilized.

Preferably, the load circuit includes a memory cell array having a plurality of memory cells, and the predetermined period of time determined by the compulsory current supply circuit depends on a size in memory of the memory cell array.

Thus if semiconductor integrated circuit devices of various types have different memory sizes the internal power supply node can have a level in potential stabilized.

More preferably, the semiconductor integrated circuit device further includes a decouple capacitance connected to the internal power supply node, wherein the internal power supply generation circuit includes a plurality of compulsory current supply circuits and determines from a size of the decouple capacitance how many of the plurality of compulsory current supply circuits should be activated.

Thus if semiconductor integrated circuit devices of various types have different decouple capacitances the internal power supply node can have a level in potential stabilized.

Preferably, the load circuit includes a memory cell array having a plurality of memory cells, and the internal power supply generation circuit includes a plurality of compulsory current supply circuits and determines from a size in memory of the memory cell array how many of the plurality of compulsory current supply circuits should be activated.

Thus if semiconductor integrated circuit devices of different types have different memory sizes the internal power supply node can have a level in potential stabilized.

Preferably, the overcharge prevention circuit includes a decision circuit making a decision as to whether the external power supply potential is higher than a predetermined potential, and the overcharge prevention circuit outputs a decision signal activated for the external power supply potential higher than the predetermined potential, and the compulsory current supply circuit includes a period decision circuit determining the predetermined period of time in response to the decision signal.

Thus if the external power supply potential varies the internal power supply node can have a level in potential stabilized.

Preferably the decision circuit makes the decision when an externally input, decision start signal has an active state.

Thus the decision circuit can pass a reduced through current.

Preferably the predetermined potential is the reference potential.

Preferably the period decision circuit includes a delay circuit having a plurality of inverters and is operative in response to the decision signal to determine a number of the inverters to be operated.

Thus the internal power supply node can receive an amount of current determined in response to a variation of the external power supply potential.

Preferably the period decision circuit includes a delay circuit having an inverter and a transistor element provided to adjust a current flowing through the inverter, the transistor element having a control electrode receiving a potential provided in response to the decision signal.

Thus the internal power supply node can receive an amount of current determined in response to a variation of the external power supply potential.

Preferably the overcharge prevention circuit invalidates a function of the compulsory current supply circuit when an external signal is activated.

Preferably the semiconductor integrated circuit device has a test mode and the external signal is activated in the test mode.

Preferably the semiconductor integrated circuit device is capable of conducting a burn-in test and the external signal is activated when the burn-in test is conducted.

Thus when the semiconductor integrated circuit device is performing the test the operation of the CCS circuit can stop to prevent the internal power supply node from attaining an unnecessarily high level in potential.

More preferably the overcharge prevention circuit in the test mode sets as the external power supply potential the reference potential input to the second differential amplification node of the first differential amplification circuit.

Thus in the test mode the internal power supply node can continue to have the external power supply potential and it can be prevented from having a level in potential higher than the external power supply potential.

In accordance with the present invention a semiconductor integrated circuit device can have therein a VDC prevented from overcharging an internal power supply node. Thus there can be provided a semiconductor integrated circuit device employing a steady internal power supply potential.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
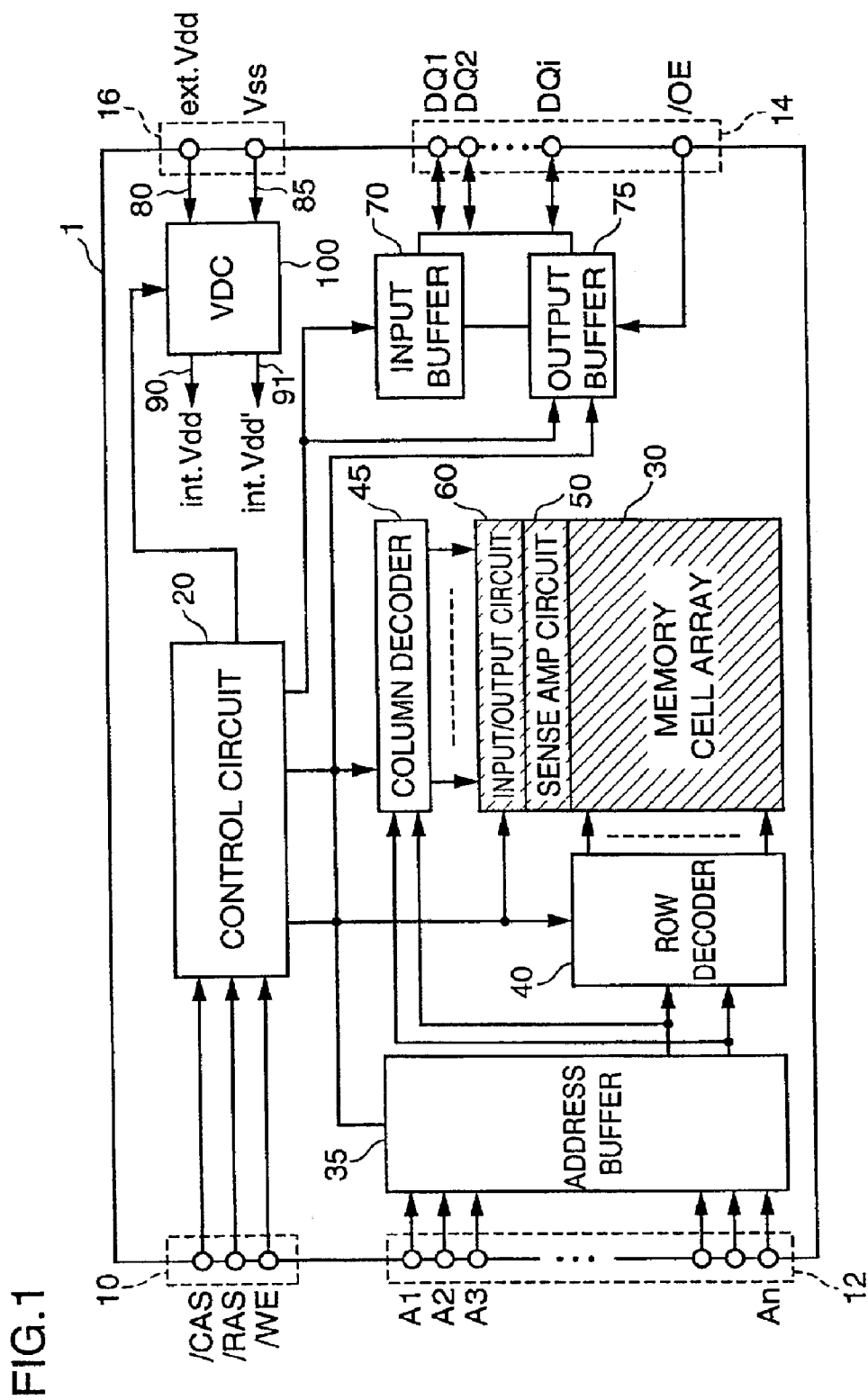
FIG. 1 is a block diagram schematically showing a general configuration of a semiconductor integrated circuit device having a VDC of a first embodiment of the present invention.

Hereinafter the embodiments of the present invention will be described with reference to the drawings more specifically. In the figures, like components are denoted by like reference characters.

First Embodiment

FIG. 1 is a block diagram schematically showing a general configuration of a semiconductor integrated circuit device 1 having a VDC of a first embodiment of the present invention.

As shown in FIG. 1, semiconductor integrated circuit device 1 includes a control signal input terminal 10 receiving control signals such as a column address strobe signal /CAS, a row address strobe signal /RAS and a write enable signal /WE, an address input terminal 12 receiving address signals A1–An, wherein n represents a natural number, a data input terminal 14 communicating input/output data DQ1–DQi and an output enable signal /OE, wherein i represents a natural number, and a power supply input terminal 16 receiving an external power supply potential ext.Vdd and a ground potential Vss.

Semiconductor integrated circuit device 1 further includes a control circuit 20, a memory array 30, an address buffer 35, a row decoder 40 and a column decoder 45, a sense amplifier circuit 50, an input buffer 70, and an output buffer 75.

Control circuit 20 generally controls semiconductor integrated circuit device 1 in response to a control signal input through control signal input terminal 10.

Memory cell array 30 has a plurality of memory cells arranged in rows and columns. A word line is arranged for each row of memory cells and a bit line is arranged for each column of memory cells. Each memory cell is arranged at an intersection of a word line and a bit line.

Address buffer 35 receives an externally address signal and outputs it to row decoder 40 and column decoder 45 selectively. In response to a row address signal received from address buffer 35, row decoder 40 drives at least one of the plurality of word lines. In response to a column address signal received from address buffer 35, column decoder 45 drives at least one of the plurality of pairs of bit lines. Sense amplifier circuit 50 includes a plurality of sense amplifiers. Each sense amplifier is arranged for a pair of bit lines to amplify a difference in potential between the paired bit lines.

Input/output circuit 60 supplies to output buffer 75 a level in potential of a pair of bit lines selected by column decoder 45. Output buffer 75 amplifies the received level in potential and externally outputs it as output data DQ–DQi. When input buffer 70 externally receives input data DQ1–DQi it amplifies the data. Input/output circuit 60 receives amplified input data DQ–DQi and supplies the data to a pair of bit lines selected by column decoder 45.

Semiconductor integrated circuit device 1 further includes a VDC 100 outputting an internal power supply potential int.Vdd in response to an external power supply potential ext.Vdd and a ground potential Vss input through a power supply input terminal 16. The external power supply potential is supplied to VDC100 via an external power supply node 80. Ground potential Vss is supplied to VDC100 via a ground node 85.

Figure 30:
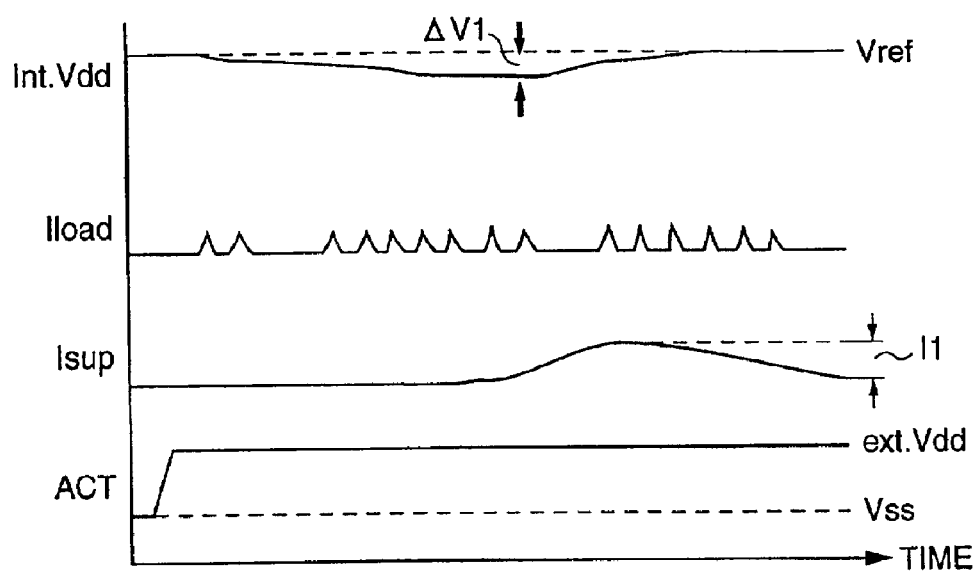
FIG. 30 is timing plots representing an operation of a VDC corresponding to one example of a load current Iload.
Figure 31:
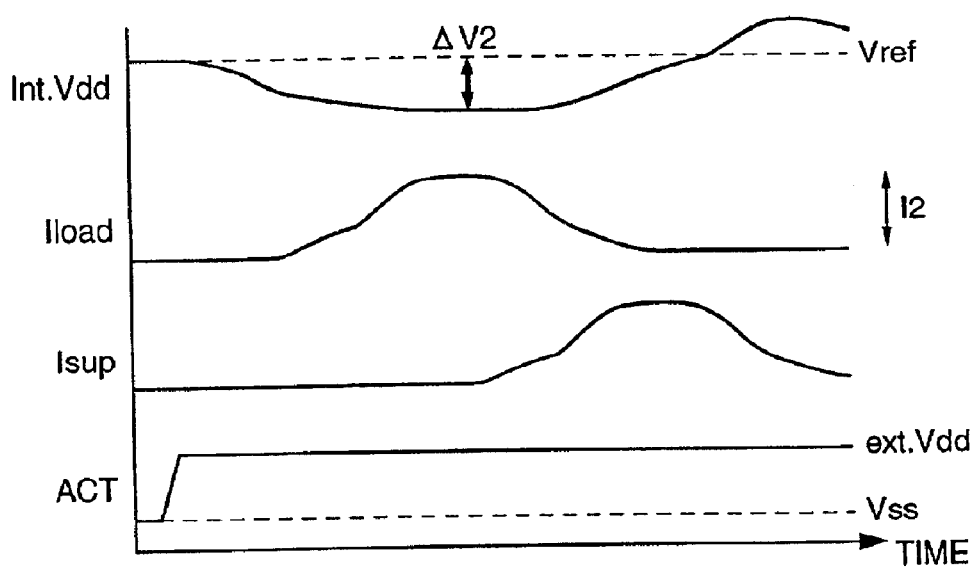
FIG. 31 is timing plots representing an operation of the VDC corresponding to another example of load current Iload.

Generally, peripheral circuitry other than memory cell array 30, sense amplifier circuit 50 and input/output circuit 60 consumes a load current Iload, as shown in FIG. 30 in waveform, whereas memory cell array 30, sense amplifier circuit 50 and input/output circuit 60 (hereinafter also generally be referred to as a memory cell array) consume load current Iload having a large amplitude, as shown in FIG. 1 in waveform, when sense amplifier circuit 50 amplifies data.

As such, a VDC for peripheral circuitry and a VDC for a memory cell array are often provided independently. The present embodiment also provides a VDC for peripheral circuitry and a VDC for a memory cell array independently.

In the present embodiment, a VDC for memory cell array provided in VDC100 will be described. The VDC for a memory cell array supplies an internal power supply node 90 with an internal power supply potential int.Vdd.

A VDC for peripheral circuitry supplies internal power supply node 90 with an internal power supply potential int.Vdd. The VDC for peripheral circuitry has the same circuit configuration as the conventional VDC shown in FIG. 29.

Note that while in FIG. 1 semiconductor integrated circuit device 1 is shown as an asynchronous DRAM it may be a synchronous DRAM.

Figure 2:
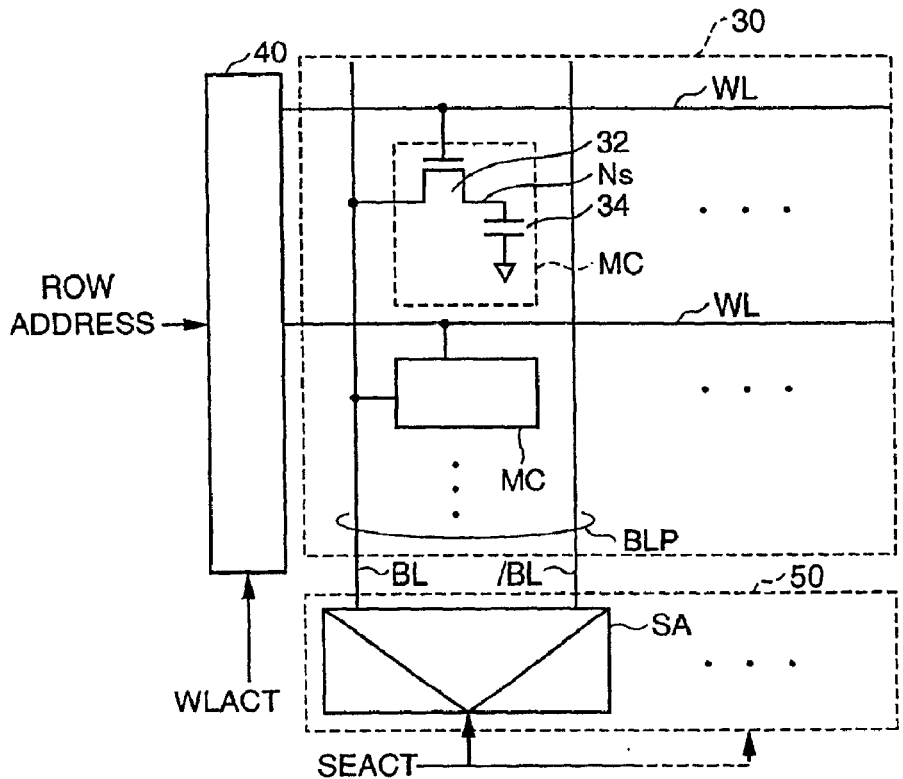
FIG. 2 is a circuit block diagram showing a configuration of a memory cell array and a sense amplifier circuit.

FIG. 2 is a circuit block diagram showing a configuration of memory cell array 30 and sense amplifier circuit 50.

As shown in FIG. 2, memory cell array 30 has a plurality of memory cells MCs arranged in rows and columns. Memory cell MC includes an access transistor 32 and a data holding capacitor 34. Access transistor 32 is coupled between one bit line BL of a pair of bit lines arranged for each column of memory cells and a data storage node Ns. Access transistor 32 has its gate coupled with a word line WL provided for each row of memory cells MCs.

When a word line activation signal WLACT is activated, row decode 40 responsively activates word line WL corresponding to a row address signal. At each memory cell MC corresponding to the active word line, bit line BL and data storage node Ns are coupled together and data in memory cell MC is read or data is written to memory cell MC. In each memory cell MC corresponding to an inactive word line, an electric charge transmitted to data storage node Ns is held by data holding capacitor 34.

Sense amplifier circuit 50 includes a sense amplifier SA arranged for each pair on bit lines BLP.

When sense amplifier activation signal SEACT is activated, sense amplifier SA responsively amplifies a difference in potential introduced between bit lines BL and /BL of bit line pair BLP.

Figure 3:
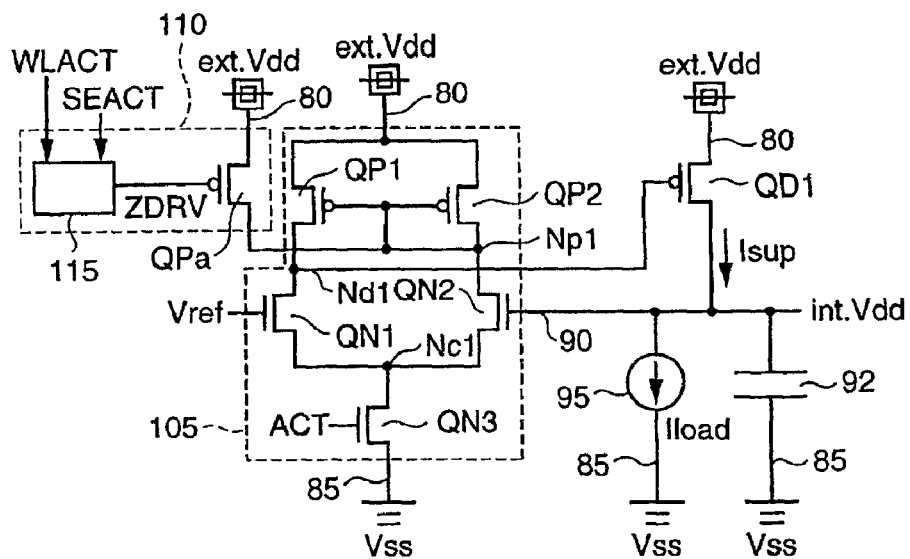
FIG. 3 is a circuit diagram showing a configuration of the VDC of the first embodiment.

FIG. 3 is a circuit diagram showing a configuration of VDC100 of the first embodiment.

As shown in FIG. 3, VDC100 includes an external power supply node 80 supplying an external power supply potential ext.Vdd, an internal power supply node 90 supplying an internal power supply potential int.Vdd, a differential amplification circuit 105, a current supply transistor QD1, and a decouple capacitor 92.

A load 95 receives internal power supply potential int.Vdd from internal power supply node 90 and consumes load current Iload. Load 95 is for example sense amplifier circuit 50 shown in FIG. 1.

Differential amplification circuit 105 is connected between external power supply node 80 and ground node 85. Differential amplification circuit 105 includes P channel MOS transistors QP1, QP2, and N channel MOS transistors QN1–QN3. Transistors QP1, QP2 and QN1–QN3 form a current mirror amplifier. Transistor QN1 has its gate receiving a reference potential Vref and transistor QN2 has its gate receiving internal power supply potential int.Vdd. Transistors QP1 and QP2 have their respective gates connected to a node Np1. When a control signal ACT is activated, transistor QN3 responsively supplies an operating current for the current mirror amplifier.

Transistors QP1, QP2 and QN1–QN3 forming the current mirror amplifier are designed to each operate in a saturation region. Thus in differential amplification circuit 105. Consequently, at node Nd1 appears the gate potential difference of transistors QN1 and QN2 that is amplified. Node Nd1 is connected to the gate of current supply transistor QD1.

Thus, if internal power supply node 90 has internal power supply potential int.Vdd lower than reference potential Vref, current supply transistor QD1 supplies current from external power supply node 80 to internal power supply node 90. If internal power supply potential int.Vdd is higher than reference potential Vref, current supply transistor QD1 is turned off to prevent internal power supply node 90 from receiving current from external power supply node 80.

VDC100 further includes a compulsory current supply (CCS) control circuit 110. CCS control circuit 110 compulsorily effects the current supply from external power supply node 80 to internal power supply node 90 for a predetermined period of time regardless of the difference in potential between internal power supply potential int.Vdd and reference potential Vref.

CCS control circuit 110 includes an internal power supply control circuit 115 and a P channel MOS transistor QPa. Internal power supply control circuit 115 outputs a compulsory current supply (CCS) control signal ZDRV to control a period of time for compulsorily supplying electric current to internal power supply node 90. CCS control signal ZDRV is input to the gate of transistor QPa.

Internal power supply control circuit 115 drives CCS control signal ZDRV low. In response to the activation of CCS control signal ZDRV, transistor QPa allows current to be supplied from external power supply node 80 to node Np1. In response, node Np1 has it level in potential increased. In contrast, node Nd1, sharing an operating current with node Np1, has its level in potential reduced. As a result, current supply transistor QD1 supplies supply current Isup increased.

In other words, regardless of internal power supply potential int.Vdd, VDC100 can compulsorily supply internal power supply node 90 with electric current in response to CCS control signal ZDRV activated.

Figure 4:
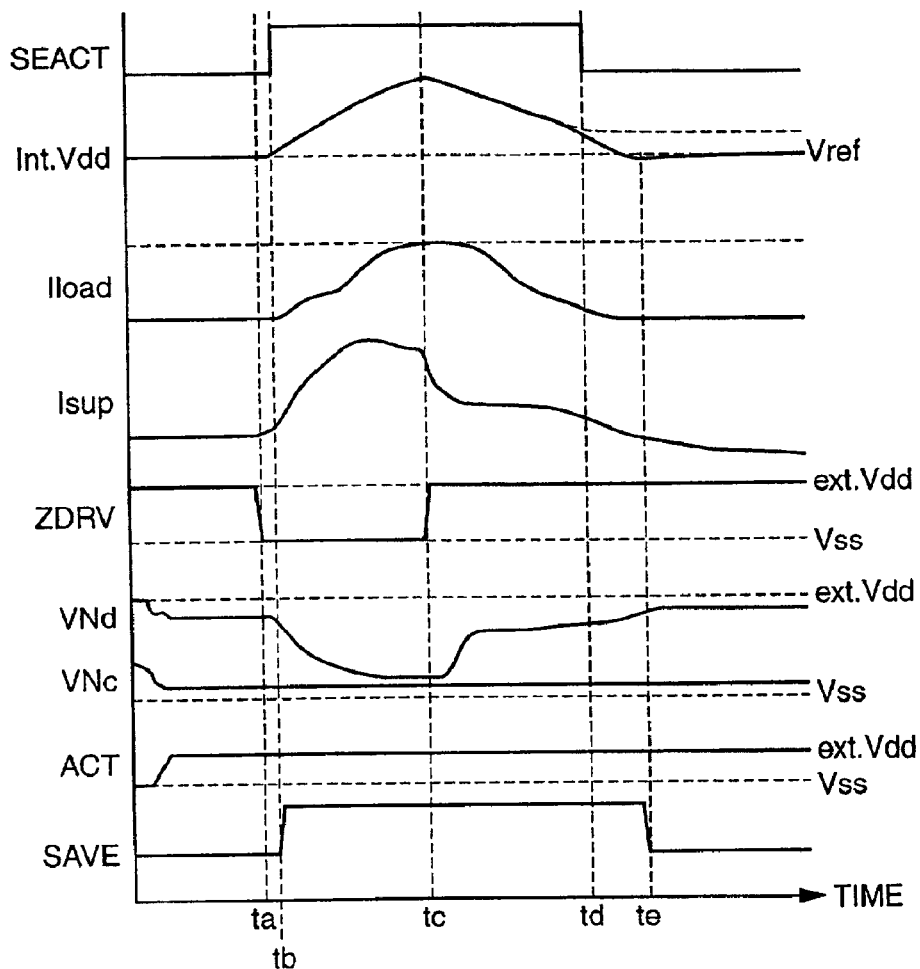
FIG. 4 is timing plots representing an operation of the VDC.

VDC100 operates, as will be described below:

FIG. 4 is timing plots representing an operation of VDC100.

As shown in FIG. 4, when control signal ACT is activated, in differential amplification circuit 105 node Nc1 has its level in potential dropping to the ground potential level Vss. Consequently, an operating current for differential amplification circuit 105 is supplied. In response, VDC100 is driven by a result of comparing internal power supply potential int.Vdd and reference potential Vref, to control current Isup supplied by current supply transistor QD1.

Then, CCS control signal ZDRV is driven low and thus activated QPa at time ta earlier than a timing at which a load (e.g., sense amplifier SA) starts consuming electric current. In response, node Np1 is forced to receive current and its potential level is thus increased. Consequently, current supply transistor QD1 has its gate potential reduced and current is compulsorily supplied from external power supply node 80 to internal power supply node 90.

At time tb a control signal (e.g., sense amplifier activation signal SEACT) is activated and load 95 responsively starts consuming load current Iload, when, with VDC100 having already, compulsively supplied internal power supply node 90 with supply current Isup excessively, without significantly depending on decouple capacitor 92 internal power supply potential int.Vdd does not drop.

Then, at time tc before power consumption at load 95 ends, CCS control signal ZDRV is driven high and thus inactivated. Furthermore at time td a control signal (e.g., sense amplifier activation signal SEACT) is inactivated, load 95 responsively terminates consuming electric current. Note that if load 95 is sense amplifier SA, load current Iload consumption peaks during an initial period following time tb and thereafter it decreases. CCS control signal ZDRV is inactivated at a timing set with taken into account the pattern in waveform of the current consumed by each load 95.

From time tc on, the forced current supply to node Np1 stops. Thus the amount of current Isup supplied by current supply transistor QD1 is controlled according to a result of comparing internal power supply potential int.Vdd and reference potential Vref, as it is before time ta.

Thus VDC100 stops forced current supply to internal power supply node 90 before load 95 ends consuming current. Thus VDC100 can prevent internal power supply node 90 from being overcharged to excessively increase internal power supply potential int.Vdd.

Thus in VDC100 CCS control signal ZDRV controls a timing of forced current supply to internal power supply node 90. Thus it is very important to set an appropriate activation period of CCS control signal ZDRV.

A description will now be provided of a timing at which CCS control signal ZDRV is activated.

Figure 5:
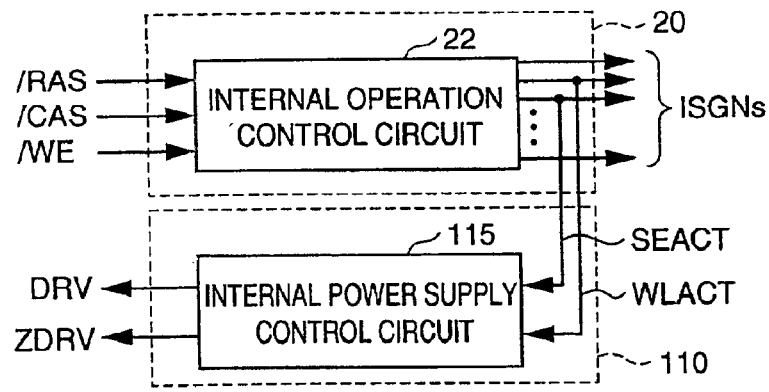
FIG. 5 is a block diagram showing an input and output relationship of an internal power supply control circuit.

FIG. 5 is a block diagram showing an input/output relationship of internal power supply control circuit 115.

As shown in FIG. 5, control circuit 20 includes an internal operation control circuit 22 provided to control a timing of an operation of each internal circuit of semiconductor integrated circuit device 1. Internal operation control circuit 22 is responsive to control signals /CAS, /RAS, /WE input through control signal input terminal 10, to generate and output to each internal circuit a group of control signals ISGNs for performing data write and read operations and the like. The group of control signals ISGNs includes a word line activation signal WLACT and a sense amplifier activation signal SEACT provided to effect a sense amplifier operation.

CCS control circuit 110 includes internal power supply control circuit 115 receiving word line activation signal WLACT and sense amplifier activation signal SEACT to generate CCS control signals DRV and ZDRV provided to control VDC100. CCS control signal DRV is driven high and thus activated for a period in which internal power supply node 90 is forced to receive current, and CCS control signal ZDRV is driven low and thus activated for a period in which internal power supply node 90 is forced to receive current.

Figure 6:
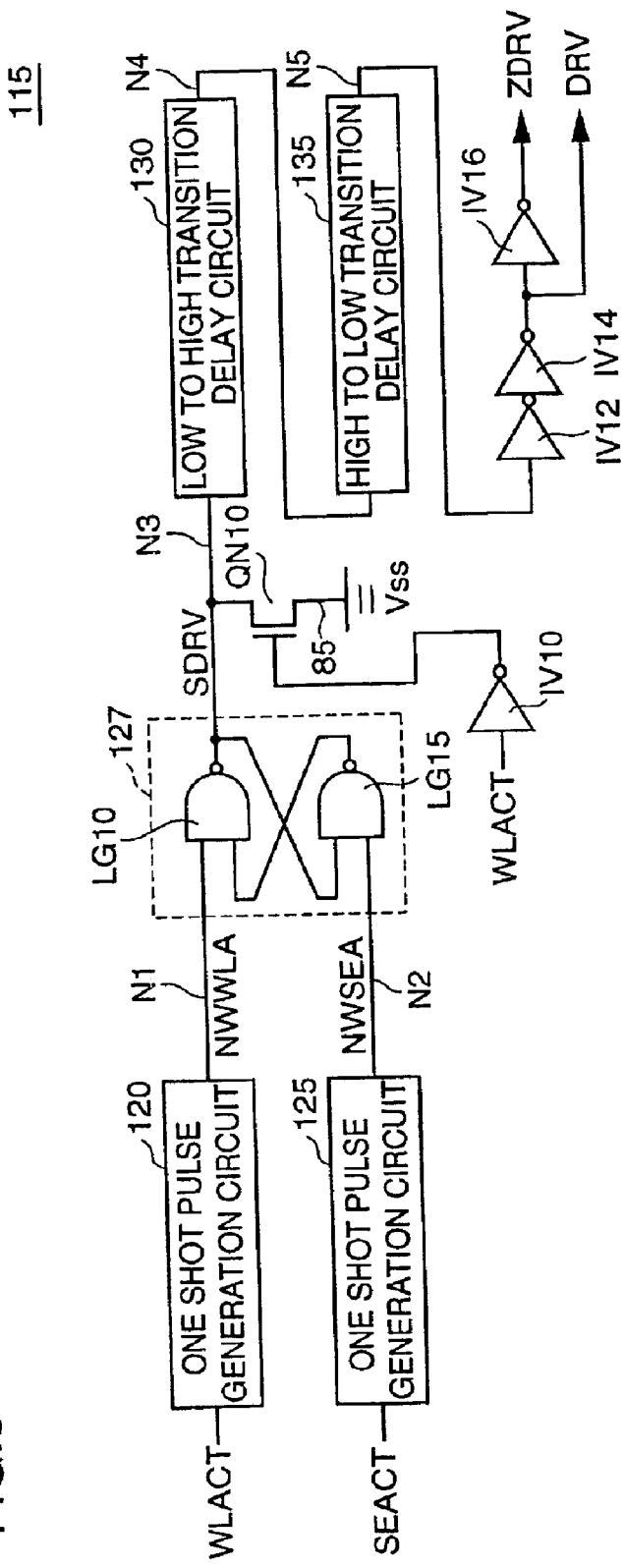
FIG. 6 is a circuit diagram showing a configuration of the internal power supply control circuit.

FIG. 6 is a circuit diagram showing a configuration of internal power supply control circuit 115.

As shown in FIG. 6, internal power supply control circuit 115 includes a one shot pulse generation circuits 120, 125 and a flip-flop 127.

One shot pulse generation circuit 120 is responsive to activation of word line activation signal WLACT to drive a one shot pulse signal NWWLA low to activate the signal and output it to a node N1. One shot pulse generation circuit 125 is responsive to activation of sense amplifier activation signal SEACT to drive a one shot pulse signal NWSEA low to activate the signal and output it to a node N2. Flip-flop 127 includes logic gates LG10 and LG15 and receives one shot pulse signals NWWLA and NWSEA as a set input and a reset input, respectively.

One shot pulse signals NWWLA and NWSEA are activated in a one shot when word line activation signal WLACT and sense amplifier activation signal SEACT are activated. Flip-flop 127 generates an output signal SDRV on a node N3. Output signal SDRV is driven high and thus activated whenever one shot pulse signal NWWLA is activated or word line activation signal WLACT is activated. Output signal SDRV is reset to have a low level and thus inactivated whenever one shot pulse signal NWSEA is activated or sense amplifier activation signal SEACT is activated.

Internal power supply control circuit 115 further includes a low to high transition delay circuit 130 connected between nodes N3 and N4, and a high to low transition delay circuit 135 connected between nodes N4 and N5. Low to high transition delay circuit 130 transmits output signal SDRV having a low to high transition delayed thereby. High to low transition delay circuit 135 transmits output signal SDRV a high to low transition delayed thereby.

Figure 7:
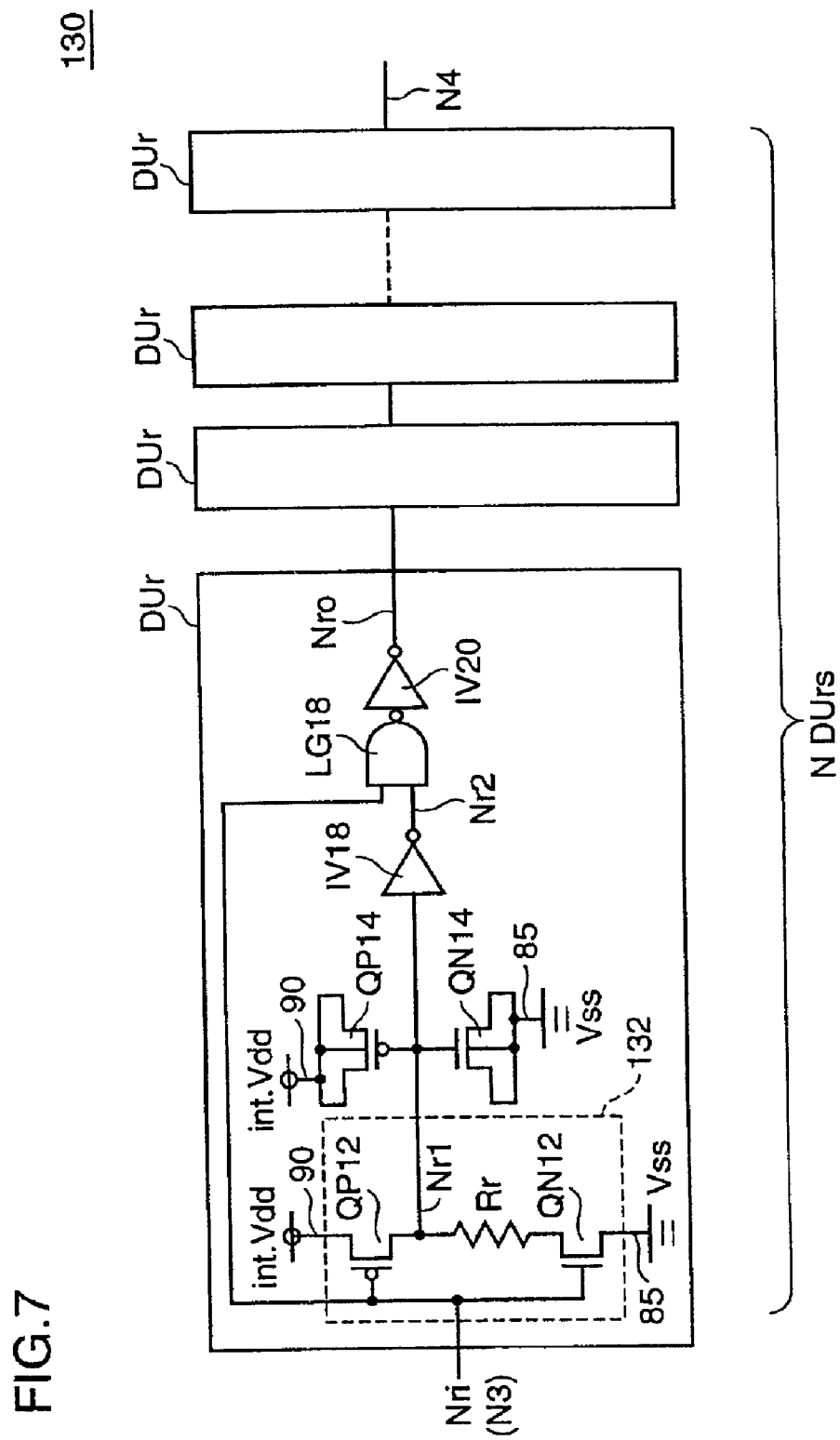
FIG. 7 is a circuit diagram showing a configuration of a low to high transition delay circuit.

FIG. 7 is a circuit diagram showing a configuration of low to high transition delay circuit 130.

As shown in FIG. 7, low to high transition delay circuit 130 has N delay units DUrs connected in series, wherein N represents a natural number. Each delay unit DUr has an input node Nri receiving a signal which is in turn has a low to high transition thereof delayed by the delay unit and it is thus transmitted to an output node Nro. The initial delay unit DUr has input node Nri connected to node N3. The final delay unit DUr has output node Nro connected to node N4.

Delay unit DUr includes an inverter 132, a P channel MOS transistor QP14 and an N channel MOS transistor QN14. Inverter 132 is configured by a P channel MOS transistor QP12, an N channel MOS transistor QN12 and a delay resistor Rr and it inverts in level a signal of input node Nri and transmits it to node Nr1. Transistors QP14 and QN14 are connected to node N1 and form a delay capacitance.

Delay unit DUr also includes inverters IV18, IV20 and a logic gate LG18. Inverter IV18 inverts a signal on node Nr1 in level and transmits it to node Nr2. Logic gate 18 outputs an NAND of nodes Nri and Nr2. Inverter IV20 inverts an output of logic gate 18 and transmits it to output node Nro.

If on input node Nri a signal has a level transitioning from low to high, in order for delay unit DUr to have on output node Nro a signal having a level transitioning from low to high, on input node Nri a signal needs to have a level going high and on node Nr2 a signal needs to have a level also going high. When on node Nr2 a level in potential transitions high it is affected by delay resistor Rr and transistors QP12 and QN12 serving as a delay capacitance.

If on input node Nri a signal has a level transitioning from high to low, a signal on one of input nodes Nri and Nr2 transitioning low allows signal on output node Nro to transition low in level.

Thus delay unit DUr receives a signal on input node Nri and transmits the signal without delaying its high to low transition, and delay unit DUr only delays a low to high transition of a signal on input node Nri before the delay unit transmits the signal. Note that a low to high transition on input node Nri is delayed by a period of time determined by resistor Rr and transistors QP12 and QN12.

Thus output signal SDRV has its low to high transition delayed by a period of time ΔTr that can be set by a delay resistance value and a delay capacitance value in delay unit DUr and a number N of delay units DUrs.

Figure 8:
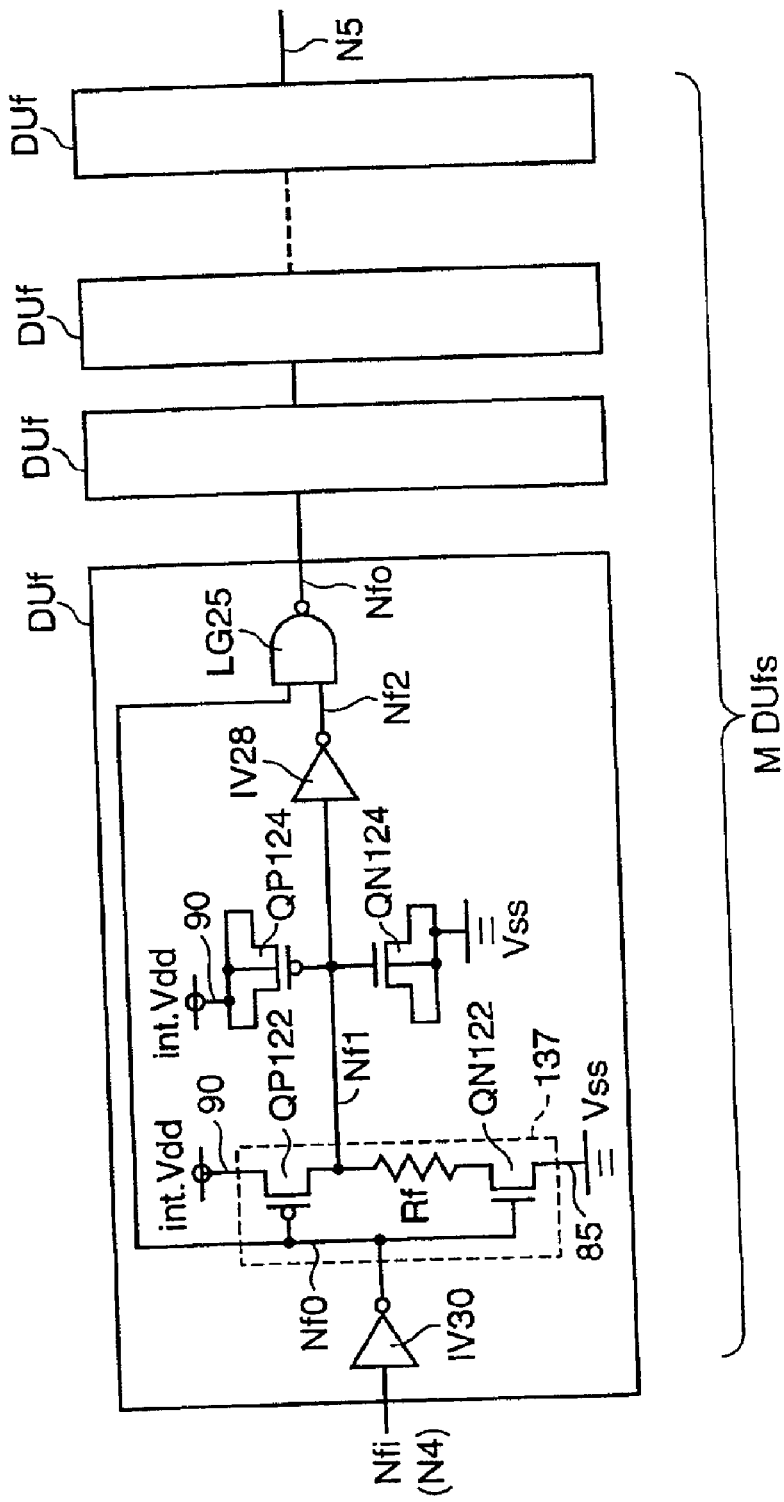
FIG. 8 is a circuit diagram showing a configuration of a high to low transition delay circuit.

FIG. 8 is a circuit diagram showing a configuration of high to low transition delay circuit 135.

As shown in FIG. 8, high to low transition delay circuit 135 includes M delay units DUfs connected in series, wherein M represents a natural number. Each delay unit DUf has an input node Nfi receiving a signal which is in turn has its high to low transition delayed thereby and thus transmitted to an output node Nfo. The initial delay unit DUf has input node Nfi connected to a node N4. The final delay unit DUf has output node Nfo connected to a node N5.

Delay unit DUf includes an inverter 137, an IV30, a P channel MOS transistor QP124, an N channel MOS transistor QN124, an inverter IV28, and a logic gate LG25. Inverter 137 is configured of a P channel MOS transistor QP122, an N channel MOS transistor QN122 and a delay resistor Rf, and it inverts in level a signal received on input node Nf0 and transmits it to node Nf1. Inverter IV30 inverts in level a signal received on input node Nfi and transmits it to node Nf0. Transistors QP124 and QN124 are connected to node Nf1 to form a delay capacitance. Logic gate 25 outputs an NAND of nodes Nf0 and Nf2.

The delay unit Duf inverter 137, transistors QP124 and QN124, inverter IV28 and logic gate LG25 correspond to the FIG. 7 delay unit DUr inverter 132, transistors QP14 and QN14, inverter IV18 and gate LG20, respectively.

Delay unit DUf is different from the FIG. 7 delay unit DUr in that a signal on input node Nfi is inverted in level by inverter IV30 and thus transmitted to inverter 137 and that an output of logic gate LG25 is transparently transmitted to output node Nfo.

Thus when input node Nfi transitions from low to high, input node Nfi is transmitted immediately to output node Nfo by inverter IV30 and logic gate LG25. When input node Nfi transitions from high to low, input node Nfi is transmitted to output node Nfo after a delay time determined by resistor Rf and transistors QP124 and QN124 has elapsed.

Thus a delay time Δtf determined in high to low transition delay circuit 135 can be set by a resistance value of resistor Rf in delay unit Duf, a delay capacitance value of transistors QP124 and QN124, and a number N of delay units DUfs.

Thus low to high transition delay circuit 130 and high to low transition delay circuit 135 can depend on a resistance element and a capacitance element to determine a delay time and are thus hardly affected by variation in temperature and that in internal power supply potential.

Again with reference to FIG. 6, when word line activation signal WLACT is activated, flip-flop 127 responsively activates output signal SDRV (or drives it from low to high), which is in turn delayed by low to high transition delay circuit 130 by delay time ΔTr and thus transmitted to node N4. When sense amplifier activation signal SEACT is activated, flip-flop 27 responsively inactivates output signal SDRV (or drives it from high to low), which is in turn delayed by high to low transition delay signal 135 by delay time ΔTf and thus transmitted to node N5.

The signal on node N5 is amplified in level by inverters IV12 and IV14 and thus output as CCS control signal DRV. An inverter IV16 outputs CCS control signal SDRV, an inverted version of signal DRV.

Thus CCS control signals DRV and ZDRV are activated when delay time ΔTr elapses after a word line is activated before a sense amplifier is activated, and CCS control signals DRV and ZDRV are inactivated when delay time ΔTf elapses after the sense amplifier is activated.

Figure 9:
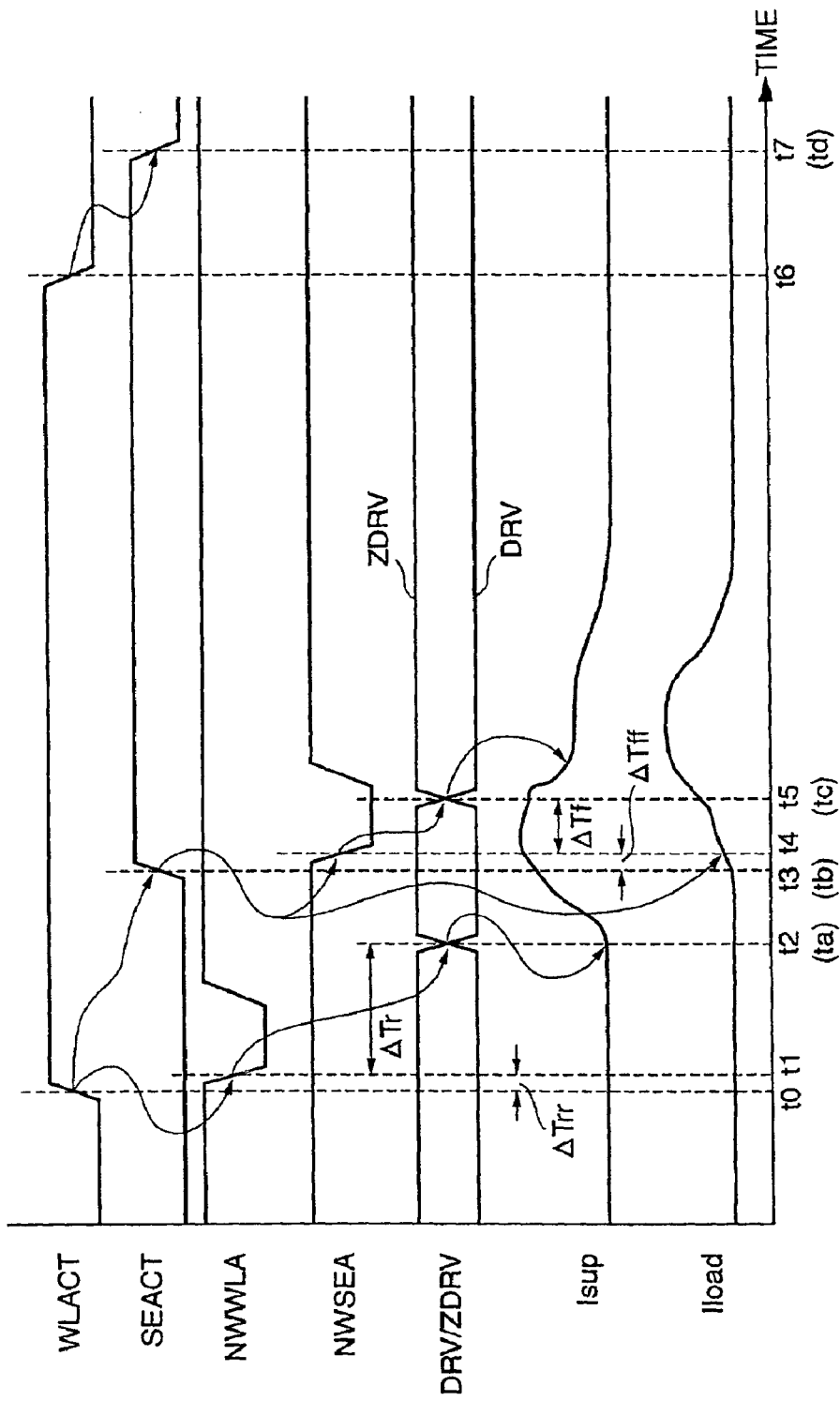
FIG. 9 is timing plots representing an operation of the internal power supply control circuit.

FIG. 9 is timing plots representing an operation of internal power supply control circuit 115.

As shown in FIG. 9, at time t0 word line activation signal WLACT is activated. Responsively, one shot pulse generation circuit 120 drives one shot pulse signal NWWLA low and thus activates it for a predetermined period following time t1, which corresponds to time t0 plus ΔTrr. As a result, flip-flop 127 outputs signal SDRV transitioning from low to high. This low to high transition is delayed by low to high transition delay circuit 130 by ΔTr. Thus CCS control signals DRV and ZDRV are activated at time t2, which corresponds to time t1 plus delay time ΔTr. Time t2 corresponds to time ta shown in FIG. 4, when in VDC100 current supply transistor QD1 has a gate potential starting to reduce and supply current Isup is forced to flow.

At time t3, corresponding to time tb shown in FIG. 4, sense amplifier activation signal SEACT is activated, and load 95 in the form of sense amplifier SA starts consuming electric current. That is, load current Iload starts to flow to load 95.

When sense amplifier activation signal SEACT is activated at time t3 and ΔTff then elapses and time t4 thus arrives, one shot pulse generation circuit 125 drives one shot pulse signal NWSEA low and thus activates it for a predetermined period of time.

Meanwhile, flip-flop 127 outputs signal SDRV transitioning from high to low. This high to low transition is delayed by high to low transition delay circuit 135 by ΔTf. Thus when since time t4 delay time ΔTf has elapsed and time t5 thus arrives, CCS control signals DRV and ZDRV are inactivated. Time t5 corresponds to time tc of FIG. 4.

At that time, VDC100 stops forced electric current supply to internal power supply node 90. Thus, load 95 is supplied with load current Iload by electric charge excessively supplied to internal power supply node 90 from time t2 through time t5.

Then at time t6 word line activation signal WLACT is inactivated and at time t7 sense amplifier activation signal SEACT is inactivated and load current Iload consumption ends.

Note from time t5 on VDC100 depends on a result of comparing internal power supply potential int.Vdd and reference potential Vref, to supply current to internal power supply node 90.

Thus VDC100 starts compulsorily supplying electric current, as timed before load 95 (sense amplifier SA) consumes electric current. Furthermore, before load 95 ends electric current consumption VDC100 stops compulsorily supplying electric current. Thus without depending on the capacitance value of decouple capacitor 92 VDC100 can prevent internal power supply potential int.Vdd from folding when load 95 starts consuming electric current.

If external power supply potential ext.Vdd is increased, however, VDC100 can supply internal power supply node 90 with excessive electric current. Furthermore, a process variation introduced can alter transistor characteristics and as a result internal power supply node 90 can also be overcharged.

If such an external power supply potential ext.Vdd variation, a fabrication process variation and the like are introduced, an overcharge prevention circuit as will be described hereinafter can stabilize internal power supply potential int.Vdd.

The overcharge prevention circuit is configured and operates, as will be described hereinafter.

Figure 10:
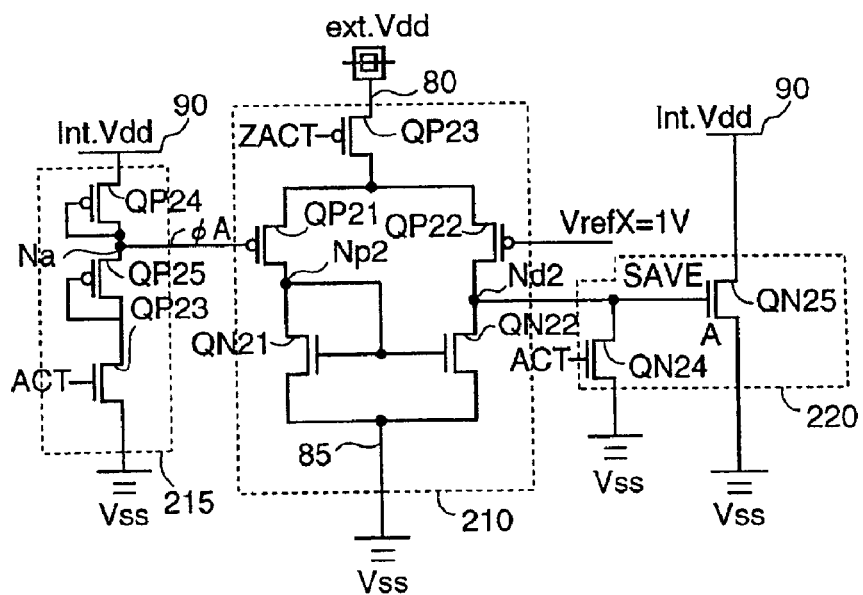
FIG. 10 is a circuit diagram showing a configuration of an overcharge prevention circuit of the first embodiment.

FIG. 10 is a circuit diagram showing a configuration of an overcharge prevention circuit 200 of the first embodiment.

As shown in FIG. 10, overcharge prevention circuit 200 includes a differential amplification circuit 210, determination signal outputting circuit 215, and a current draw circuit 220.

Circuit 215 includes P Channel MOS transistors QP24 and QP25 and an N channel MOS transistor QN23.

Transistor QP24 has a source connected to internal power supply node 90 and a drain connected to a source of transistor QP25. Transistor QP25 has a drain connected to a drain of transistor QN23. Transistor QN23 has a source connected to a ground node 85. Transistors QP24 and QP25 have their respective gates diode-connected. Transistor QN21 has a gate receiving control signal ACT.

When control signal ACT has an active state, circuit 215 outputs determined signal φA at a node Na connecting transistors QP24 and QP25 together.

Differential amplification circuit 210 is connected between external power supply node 80 and ground node 85 and includes P channel MOS transistors QP21–QP23 and N channel MOS transistors QN21 and QN22. Transistors QP21–QP23 and QN21 and QN22 configure a current mirror amplifier. Transistor QP22 has a gate receiving a reference potential VrefX and transistor QP22 has a gate receiving the signal to be determined φA. Transistors QN21 and QN22 have their respective gates connected to a node Np2. When control signal ACT is activated, transistor QP23 responsively supplies an operating current for the current mirror amplifier.

Current draw circuit 220 includes transistors QN24 and QN25. Transistor QN24 is connected between node Nd2 and ground node 85 and has a gate receiving control signal ACT. Transistor QN25 is connected between internal power supply node 90 and ground node 85 and has a gate receiving a signal SAVE output at node Nd2. Signal SAVE is a signal indicating that electric current should be drawn.

In differential amplification circuit 210, transistors QP21–QP23 and QN21 and QN22 configuring a current mirror amplifier are each designed to operate in a saturation region. As such, if the signal to be determined φA is higher than reference potential VrefX then signal SAVE goes high and transistor QN25 thus turns on. As a result, current draw circuit 220 draws electric current from internal power supply node 90 to ground node 85.

If signal φA is lower than reference potential VrefX, signals SAVE is driven low and transistor QN25 thus turns off. As a result, current draw circuit 220 stops drawing electric current from internal power supply node 90 to ground node 85.

Overcharge prevention circuit 220 as described above operates, as will be described hereinafter.

For the sake of convenience, internal power supply potential int.Vdd is 2V, the circuit outputting a signal to be determined 215 has transistors QP24 and QP25 set to be equal in channel resistance, and reference potential VrefX= 1V.

Again with reference to FIG. 4, if at time td or thereafter internal power supply node 90 has a level in potential larger than 2V, the circuit 215 node Na outputs signal φA of no less than 1V. Thus differential amplification circuit 210 outputs signal SAVE of an active state (a high level) at node Nd2 to current draw circuit 220, which in turn receives the active signal SAVE at the transistor QN25 gate and draws current from internal power supply node 90. As a result the internal power supply node 90 has a level in potential reduced. If internal power supply node 90 has a level in potential no more than 2V, circuit 215 outputs signal φA smaller than 1V. Thus the differential amplification circuit 210 node Nd2 outputs signal SAVE having a low level. Thus transistor QN25 turns off and internal power supply node 90 does not have its level in potential reduced.

With the series of operations as described above, in semiconductor integrated circuit device 1 VDC100 prevents load 95 from receiving insufficient current and overcharge prevention circuit 22 prevents internal power supply node 90 from being overcharged. Thus semiconductor integrated circuit device 1 can use a steady internal power supply potential.

Figure 29:
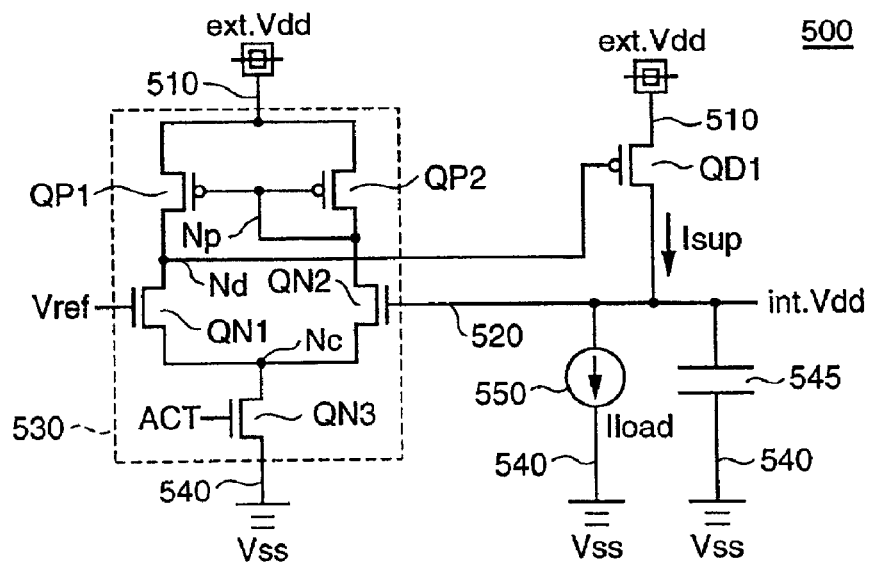
FIG. 29 is a circuit diagram showing a configuration of a conventional VDC.

Note that a semiconductor integrated circuit device using conventional VDC500 and overcharge prevention circuit 200 can also prevent overcharging an internal power supply node, wherein the FIG. 10 overcharge prevention circuit 200 is connected to the FIG. 29 VDC500 at internal power supply node 520.

Figure 11:
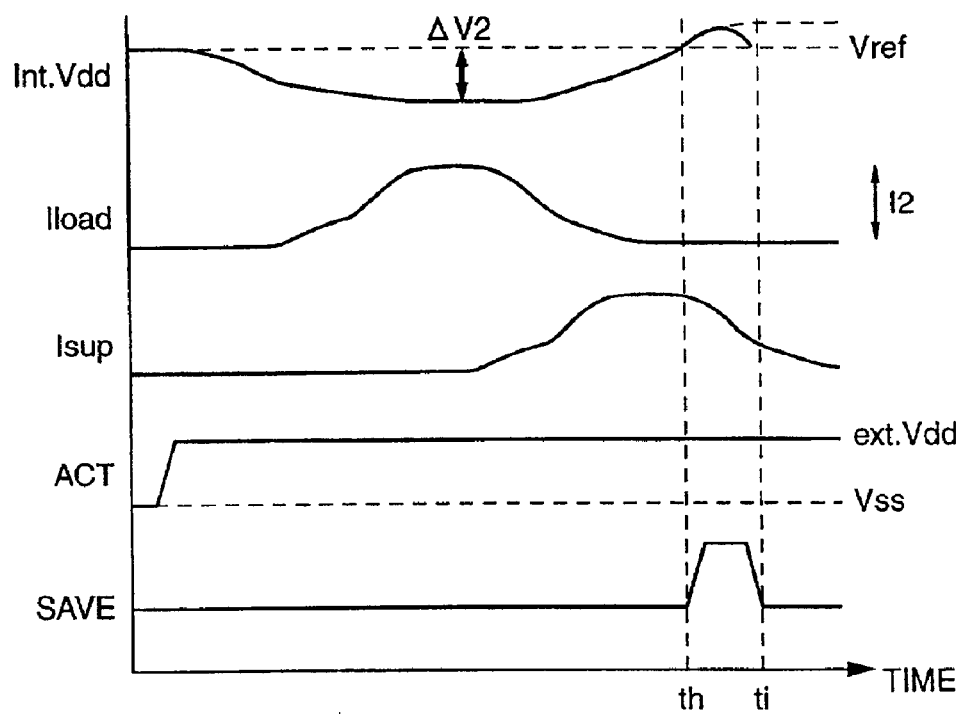
FIG. 11 is timing plots representing an operation of a conventional VDC and overcharge prevention circuit.

FIG. 11 is timing plots representing an operation of conventional VDC500 and overcharge prevention circuit 200.

With reference to FIG. 11, when a control signal ACT has an active state the VDC is activated. When a large amount of load current Iload results in a significant drop of internal power supply potential int.Vdd, supply current Isup is supplied to internal power supply node 520.

Then at time th supply current Isup overcharges internal power supply node 520 and when circuit 215 outputs signal to be determined φA exceeding reference potential VrefX differential amplification circuit 210 activates signal SAVE. Thus transistor QN25 turns on and from internal power supply node 520 electric current is drawn.

At time ti signal φA drops below reference potential VrefX and signals SAVE is responsively inactivated. As result, drawing current from internal power supply node 520 stops.

Thus a semiconductor integrated circuit device using a conventional VDC that is provided with overcharge prevention circuit 200 can also prevent overcharge attributed to the VDC.

Second Embodiment

In the first embodiment, overcharge prevention circuit 200 includes differential amplification circuit 210 with a level of 2V applied in determining whether electric current is drawn for internal power supply potential int.Vdd of a target value of 2V. In other words, if internal power supply potential int.Vdd is lower than 2V, VDC100 operates to supply internal power supply node 90 with electric current, and if internal power supply potential int.Vdd is higher than 2V, overcharge prevention circuit 200 operates to draw electric current from internal power supply node 92. This means that there is not a blank with neither VDC100 nor overcharge prevention circuit 200 in operation and the system may self-oscillates.

Thus preferably overcharge prevention circuit 200 has a level applied in determining whether to draw electric current that is higher than a target value of internal power supply potential int.Vdd.

For example, in the FIG. 10 overcharge prevention circuit 200 at differential amplification circuit 210 reference potential VrefX of 1V is changed to 1.1V.

Figure 12:
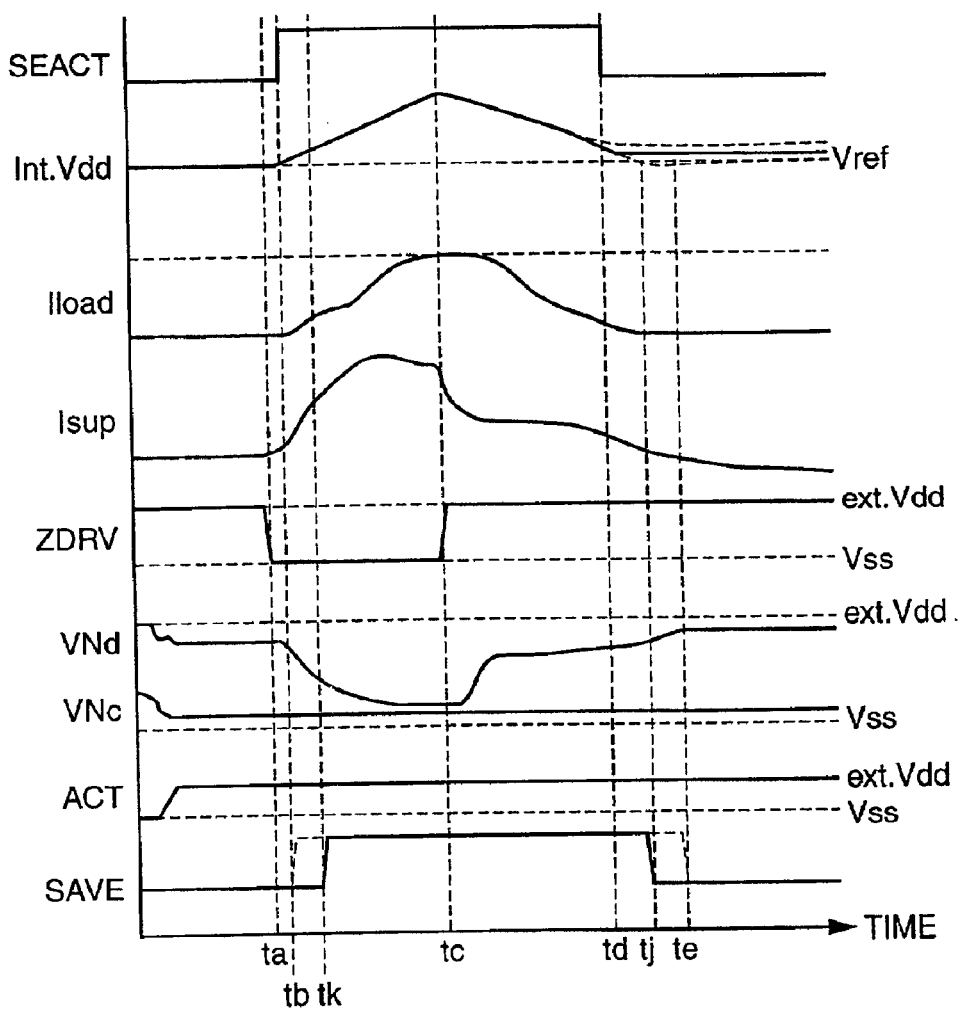
FIG. 12 is timing plots representing an operation of the overcharge prevention circuit for a reference potential VrefX=1.1V.

FIG. 12 is timing plots representing an operation of overcharge prevention circuit 200 for reference potential VrefX=1.1V.

As shown in FIG. 12, in overcharge prevention circuit 200 signal SAVE for reference potential VrefX=1.1V is activated at a later time tk than for reference potential VrefX=1.0V. Furthermore, signal SAVE is inactivated at an earlier time tj than for reference potential VrefX=1.0V. Thus from time tj through time te neither VDC100 nor overcharge prevention circuit 200 operate.

Thus, setting in the current draw circuit a level applied to determine whether to draw electric current that is set higher than a target value of the internal power supply potential, can maintain a stable state of the VDC and the current draw circuit.

Third Embodiment

As has been described in the first embodiment, current Isup is supplied to internal power supply node 90 for a period of time that is determined by low to high transition delay circuit 130 and high to low transition delay circuit 135 provided in internal power supply control circuit 115. Thus, it is desirable that if a variety of semiconductor integrated circuit devices use the same internal power supply control circuits 115, current Isup be supplied for a period of time adjusted for each type of the semiconductor integrated circuit device.

Figure 13:
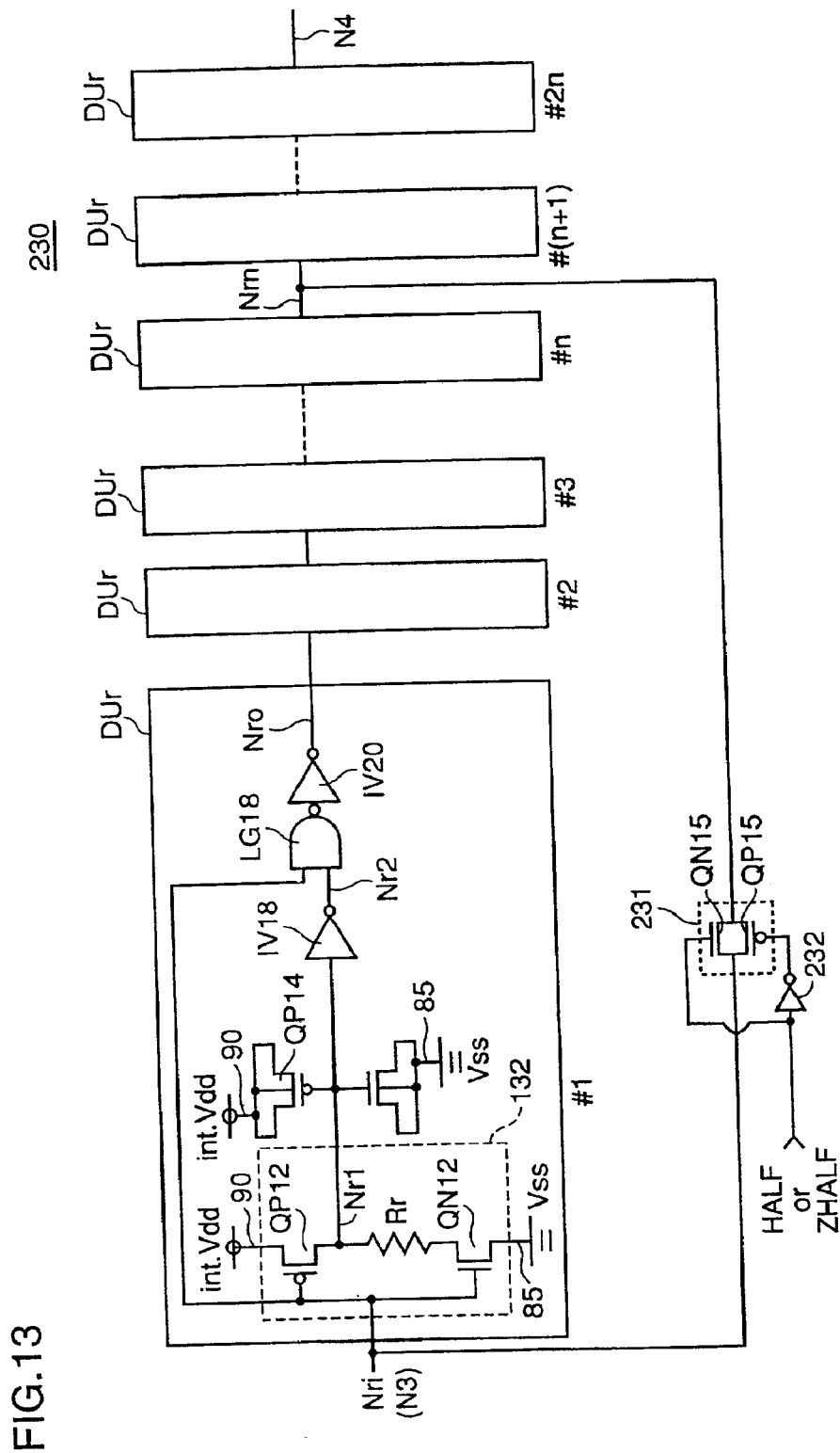
FIG. 13 is a circuit diagram showing a configuration of a low to high transition delay circuit of a third embodiment.

FIG. 13 is a circuit diagram showing a configuration of a low to high transition delay circuit 230 of the third embodiment.

As shown in FIG. 13, low to high transition delay circuit 230 has 2 n delay units DUrs connected in series, wherein n represents a natural number. Each delay unit DUr has an input node Nri receiving a signal which in turn has its low to high transition delayed thereby and transmitted to an output node Nro. The initial delay unit DUr has input node Nri connected to node N3 and the final delay unit DUr has output node Nro connected to node N4. Delay unit DUr is identical in configuration to the FIG. 7 delay unit DUr.

Low to high transition delay circuit 230 also includes a transfer gate 231 and an inverter 232. Transfer gate 231 is connected between node N3 and a node Nrn existing between an nth delay unit DUr and an (n+1)th delay unit DUr. Transfer gate 231 includes a P channel MOS transistor QP15 and an N channel MOS transistor QN15. Inverter 232 is connected to the gate of transistor QP15. The transistor QN15 gate and inverter 232 receive a switch signal HALF or SHALF.

Figure 14:
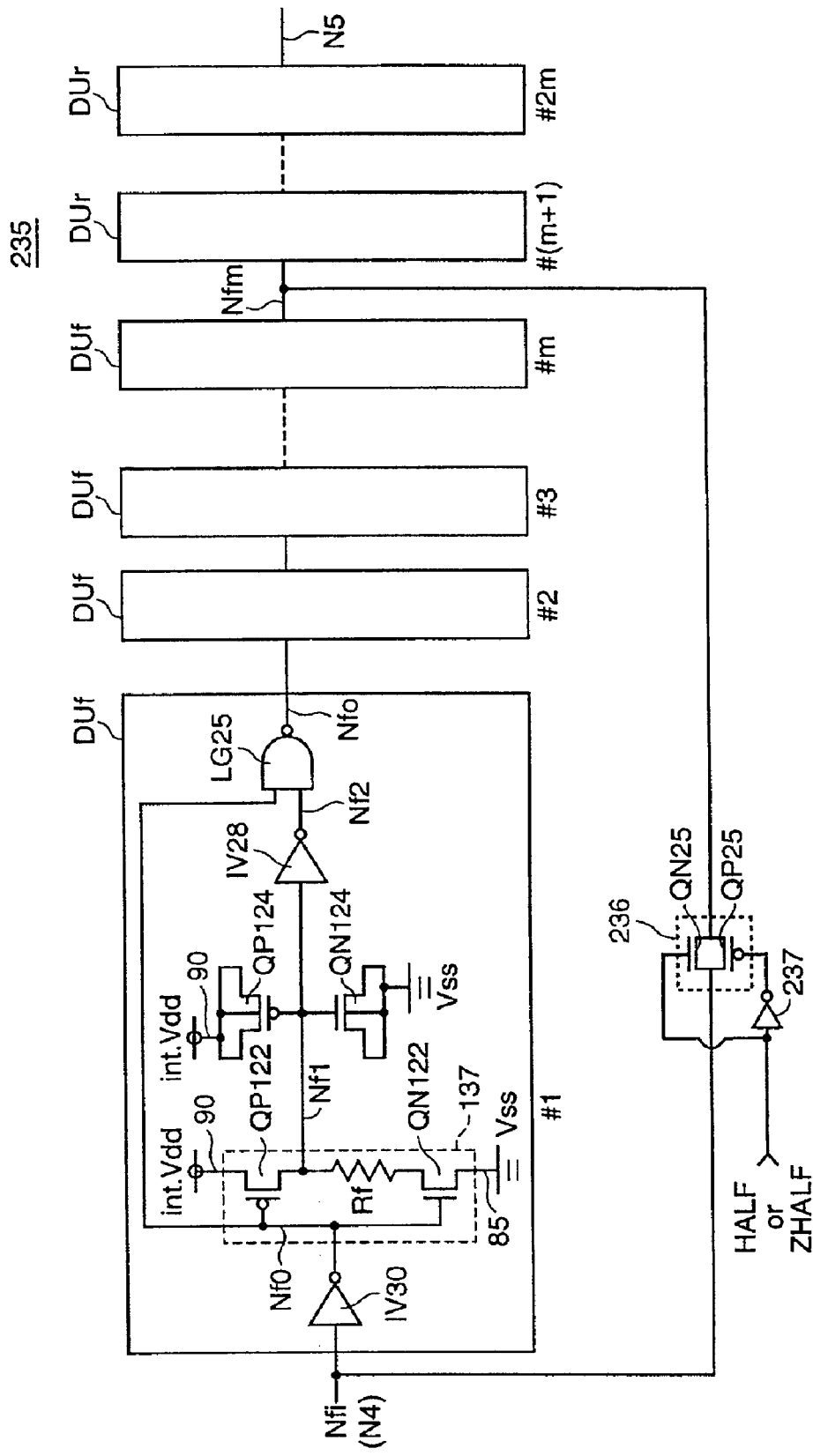
FIG. 14 is a circuit diagram showing a configuration of a high to low transition delay circuit of the third embodiment.

FIG. 14 is a circuit diagram showing a configuration of a high to low transition delay circuit 235 of the third embodiment.

As shown in FIG. 14, high to low transition delay circuit 135 includes 2 m delay units DUfs connected in series, wherein m represents a natural number. Each delay unit DUf has input node Nfi receiving a signal which in turn has its high to low transition delayed thereby and thus transmitted to an output node Nfo. The first delay unit DUf has input node Nfi connected to node N4, and the final delay unit DUf has output node Nfo connected to node N5. Delay unit DUf is identical in configuration to the FIG. 8 delay unit DUf.

High to low transition delay circuit 235 also includes transfer gates 236 and 237. Transfer gate 236 is connected between node N4 and a node Nfm existing between an mth delay unit DUf and an (m+1)th delay unit DUf. Transfer gate 236 includes a P channel MOS transistor QP25 and an N channel MOS transistor QN25. Inverter 236 is connected to the gate of transistor QP25. The transistor QN25 gate and transfer gate 237 receive switch signal HALF or ZHALF.

Note that low to high transition delay circuit 230 and high to low transition delay circuit 235 use switch signals HALF and ZHALF generated for example in the FIG. 1 control circuit 20.

A description will now be provided of an operation of internal power supply control circuit 115 including low to high transition delay circuit 230 and high to low transition delay circuit 235 configured as described above.

Figure 15:
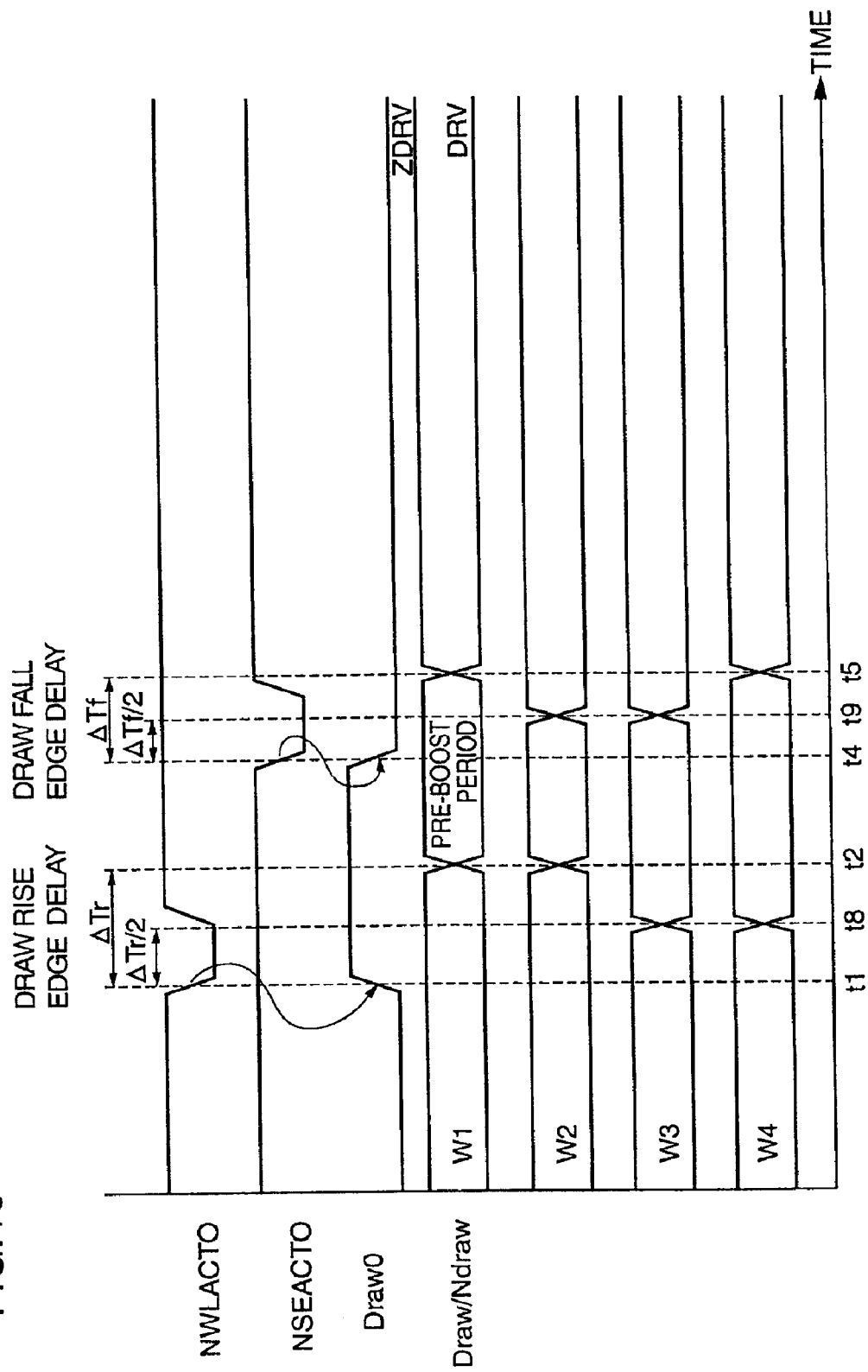
FIG. 15 is timing plots representing an operation of the internal power supply control circuit including the low to high transition delay circuit and the high to low transition delay circuit.

FIG. 15 is timing plots representing an operation of internal power supply control circuit 115 including low to high transition delay circuit 230 and high to low transition delay circuit 235.

Initially, if a semiconductor integrated circuit device includes a VDC having therein a decouple capacitor with a capacitance value C, then, as has been shown in the FIG. 9 timing plots for signals DRV and ZDRV, from time t2 through time t5 current Isup is supplied to internal power supply node 90, when CCS control signals DRV and ZDRV correspond to a timing plot W1, and in low to high transition delay circuit 230 switch signal ZHALF is driven low and thus activated, and as a result transfer gate 231 turns off. Thus, low to high transition delay circuit 230 has 2 n delay units DUrs operating. Consequently, after one shot pulse signal NWWLA is activated when ΔTr elapses signals DRV and ZDRV are activated. Similarly, in high to low transition delay circuit 235 switch signal ZHALF is driven low and thus activated. As a result, transfer gate 236 turns off. Thus high to low transition delay circuit 235 has 2 m delay units DUf operating. As a result, after one shot pulse signal NWSEA is activated when ΔTf elapses signals DRV and ZDRV are inactivated.

Description will now be provided for a VDC with a decouple capacitor having a capacitance value of C/2.

Initially, a variation in voltage of the internal power supply node is noted.

If the decouple capacitor has a capacitance value of C/2, supplying supply current Isup results in the internal power supply node having a variation in voltage greater than when the decouple capacitor has capacitance C. To reduce the variation in voltage as much as for capacitance C, supply current Isup is supplied for a reduced period of time and CCS control signals DRV and ZDRV correspond to a timing plot W2.

More specifically, in low to high transition delay circuit 230 switch signal ZHALF is driven low and thus activated and transfer gate 231 turns off. Thus, low to high transition delay circuit 230 has 2 n delay units DUrs operating. As a result, after one shot pulse signal NWWLA is activated when ΔTr elapses CCS control signals DRV and ZDRV are activated.

In high to low transition delay circuit 235 switch signal HALF is driven high and thus activated. As a result transfer gate 236 turns on and high to low transition delay circuit 235 thus has m delay units DUfs operating. As a result, after one shot pulse signal NWSEA is activated when ΔTf/2 elapses or time t9 arrives signals DRV and ZDRV are inactivated.

Thus, the VDC supplies the internal power supply node with supply current Isup for a period of time t2 through t9. Thus, supply current Isup is supplied for a period of time shorter than when the decouple capacitor has capacitance C.

Then an electric current supplied to the internal power supply node is noted.

If the decouple capacitor has capacitance C/2, load current Iload results in internal power supply potential int.Vdd folding greater than when the decouple capacitor has capacitance C. To prevent the folding of internal power supply potential int.Vdd as much as when the decouple capacitor has capacitance C, supply current Isup is supplied earlier and signals DRV and ZDRV thus correspond to a timing plot W3.

More specifically, in low to high transition delay circuit 230 switch signal HALF is driven high and thus activated and transfer gate 231 turns on. Thus low to high transition delay circuit 230 has only n delay units DUrs operating. As a result, after one shot pulse signal NWWLA is activated when ΔTr/2 elapses or time t8 arrives signal DRV and ZDRV are activated.

Furthermore in high to low transition delay circuit 235 switch signal HALF is driven high and thus activated. As a result transfer gate 236 turns on. Thus, high to low transition delay circuit 235 has m delay units DUfs operating. As a result, after one shot pulse signal NWSEA is activated when ΔTf/2 elapses or time t9 arrives CCS control signals DRV and ZDRV are inactivated.

Thus, the VDC supplies the internal power supply node with supply current Isup for a period of time t8 through t9. As a result, supply current Isup is supplied earlier than when the decouple capacitor has capacitance C.

Furthermore, supplying supply current Isup earlier for an increased period of time is also considered to reduce the folding of internal power supply potential int.Vdd as much as when the decouple capacitor has capacitance C, and signals DRV and ZDRV thus correspond to a timing plot W4.

More specifically, in low to high transition delay circuit 230 switch signal HALF is driven high and thus activated and transfer gate 231 turns on. Thus low to high transition delay circuit 230 has only n delay units DUrs operating. As a result, after one shot pulse signal NWWLA is activated when ΔTr/2 elapses or time t8 arrives CCS control signals DRV and ZDRV are activated.

Furthermore in high to low transition delay circuit 235 switch signal ZHALF is driven low and thus activated. As a result transfer gate 236 turns off. Thus high to low transition delay circuit 235 has 2 m delay units DUfs operating. As a result, after one shot pulse signal NWSEA is activated when ΔTf elapses or time t5 arrives CCS control signals DRV and ZDRV are inactivated.

Thus the VDC supplies the internal power supply node with supply current Isup for a period of time t8 through t5.

As a result, supply current Isup is supplied earlier for a longer period of time than when the decouple capacitor has capacitors C.

Thus in the low to high transition delay circuit and the high to low transition delay circuit the number of delay units that are operated is changed to change when and how long to supply the supply current. Thus a steady internal power supply potential can be supplied if semiconductor integrated circuit devices each include a VDC with a decouple capacitor having a different capacitor. While in the above is described a method of determining a period of time for supplying a supply current in response to a capacitance value of a decouple capacitor provided in a VDC, a period for supplying a supply current can also similarly be determined in response to a memory capacity provided in a semiconductor device integrated circuit.

Fourth Embodiment

In the third embodiment, internal power supply potential int.Vdd can be stabilized by supplying a supply current for a period of time changed in response for example to a capacitance of a decouple capacitor of a VDC or a memory capacity in the semiconductor integrated circuit device of interest. Internal power supply potential int.Vdd can also be stabilized by changing the amount of current supplied.

Figure 16:
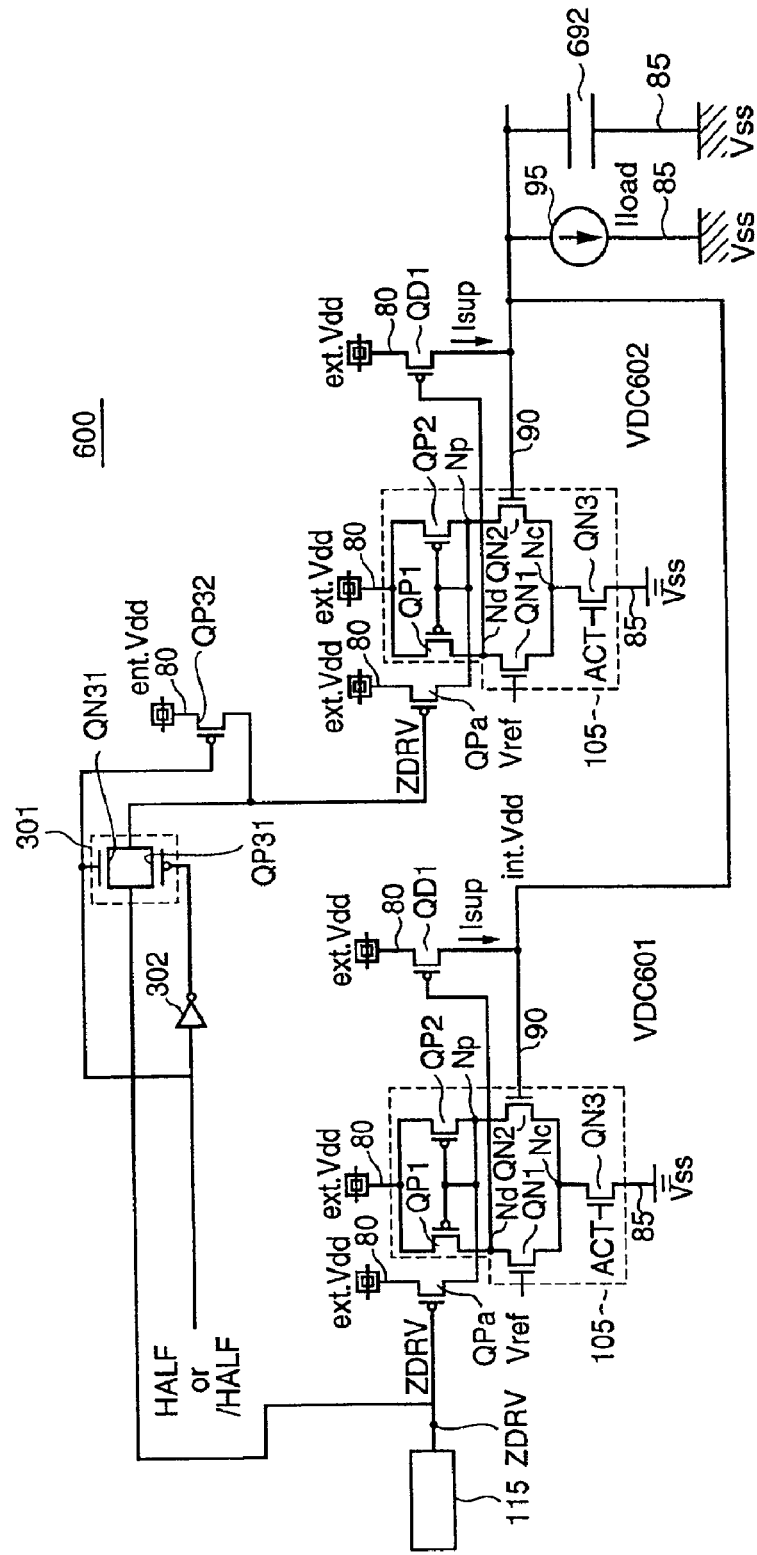
FIG. 16 is a circuit diagram showing a configuration of a VDC circuit of a fourth embodiment.

FIG. 16 is a circuit diagram showing a configuration of a VDC circuit of the fourth embodiment.

As shown in FIG. 16, a VDC600 includes VDCs 601 and 602, a transfer gate 301, an inverter 302 and a transistor QP32.

VDC601 includes a transistor QPa, a differential amplification circuit 105 and a current supply transistor QD1. They are identical in configuration to those shown in FIG. 3. VDC602 is identical in configuration to VDC601. In VDC601 transistor QPa has a gate connected to internal power supply control circuit 115.

Transfer gate 301 is configured by P channel MOS transistor QP31 and an N channel MOS transistor QN31 and it is connected between the gate of transistor QPa of VDC601 and the gate of transistor QPa of VDC602. Transistor QP31 has a gate connected to inverter 302. Transistor QN31 and inverter 302 receive switch signal HALF or ZHALF. Transistor QP32 has a source connected to external power supply node 80 and a drain connected to the gate of transistor QPa of VDC602. Transistor QP32 has a gate receiving switch signal HALF or ZHALF.

Note that as has been described in the third embodiment, switch signals HALF and ZHALF are generated for example by the FIG. 1 control circuit 20.

VDC600 also includes a decouple capacitor 692 connected between internal power supply node 90 and ground node 85.

In a semiconductor memory device having VDC 600 thus configured, decouple capacitor 692 has half the capacitance of the FIG. 3 decouple capacitor 92, for the sake of convenience.

Initially, a variation in voltage of the internal power supply node is noted.

If decouple capacitor 692 has a capacitance half that of the FIG. 3 decouple capacitor 92, supplying supply current Isup results in internal power supply potential int.Vdd with a variation in voltage greater than in FIG. 3. As such, to reduce the variation in voltage as much as for capacitance C, supply current Isup is reduced.

More specifically, switch signal ZHALF is activated. Transfer gate 301 turns off. Furthermore, transistor QP32 turns on and the VDC602 transistor QPa receives a high level signal at its gate. Thus VDC602 does not provide forced current supply. In contrast, VDC601 is driven by CCS control signal ZDRV output from internal power supply control circuit 115, to compulsorily supply current Isup. Thus, electric current is compulsorily supplied by half of the VDCs.

Thus if the variation in voltage of the internal power supply node is noted, reducing the amount of current Isup to be supplied can stabilize internal power supply potential int.Vdd.

A current supplied to the internal power supplied node will now be noted.

If decouple capacitor 692 has half the capacitance of the FIG. 3 decouple capacitor 92, load current Iload results in internal power supply potential int.Vdd folding greater than for the capacitance of decouple capacitor 92. To reduce the folding of internal power supply potential int.Vdd as much as for the capacitance of decouple capacitor 92, supply current Isup is supplied in an increased amount.

More specifically, switch signal HALF is activated. Transfer gate 301 turns on. Furthermore, transistor QP32 turns off and the VDC602 transistor QPa receives a low level signal at its gate. Thus VDCs601 and 602 compulsorily supply current Isup.

Thus if a current supplied to the internal power supply node is noted, increasing the amount of current Isup to be supplied can stabilize internal power supply potential int.Vdd.

While in the above is described a method of determining acurrent supply amount in response to a capacitance of a decouple capacitor provided in a VDC, internal power supply potential int.Vdd can also similarly be stabilized in response to a memory capacity provided in a semiconductor integrated circuit device.

Fifth Embodiment

Figure 17:
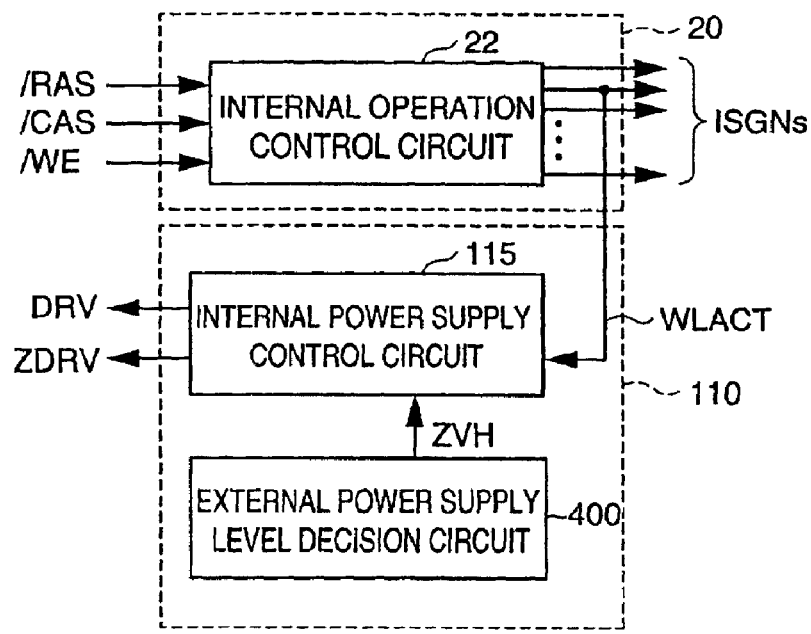
FIG. 17 is a block diagram showing an input and output relationship of the internal power supply control circuit of a fifth embodiment.

FIG. 17 is a block diagram showing an input and output relationship of internal power supply control circuit 115 of a fifth embodiment.

As shown in FIG. 17, control circuit 20 is identical to that shown in FIG. 5.

CCS control circuit 110 includes internal power supply control circuit 115 and an external power supply level decision circuit 400 detecting a level in potential of external power supply potential ext.Vdd and outputting the detection result to internal power supply control circuit 115 in a decision signal ZVH. Internal power supply control circuit 115 receives word line activation signal WLACT and decision signal ZVH to generate CCS control signals DRV and ZDRV applied to control VDC100. CCS control signal DRV is driven high and thus activated for a period of compulsory current supply to internal power supply node 90 and CCS control signal ZDRV is driven low and thus activated for a period of compulsory current supply to internal power supply node 90.

Figure 18:
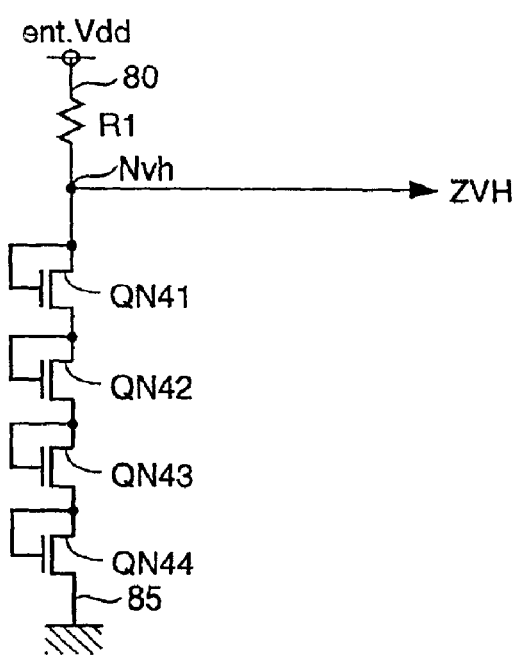
FIG. 18 is a circuit diagram showing a configuration of an external power supply level decision circuit shown in FIG. 17.

FIG. 18 is a circuit diagram showing a configuration of the FIG. 17 external power supply level decision circuit 400.

As shown in FIG. 18, external power supply level decision circuit 400 includes a resistor R1 and N channel MOS transistors QN41–QN44 connected in series between external power supply node 80 and ground node 85. Resistor R1 is connected between external power supply node 80 and transistor QN41. Between transistor QN41 and ground node 85 transistors QN42–QN44 are connected in series. Transistors QN41–QN44 are diode-connected. External power supply level decision circuit 400 outputs signal ZVH at a node Nvh connecting resistor R1 and transistor QN41 together. As shown in FIG. 18, four transistors are provided in series, although circuit 400 may include any number of transistors that is determined to allow a total of threshold values of the transistors to be equal to a potential of node Nvh provided when external power supply potential ext.Vdd does not vary.

Figure 19:
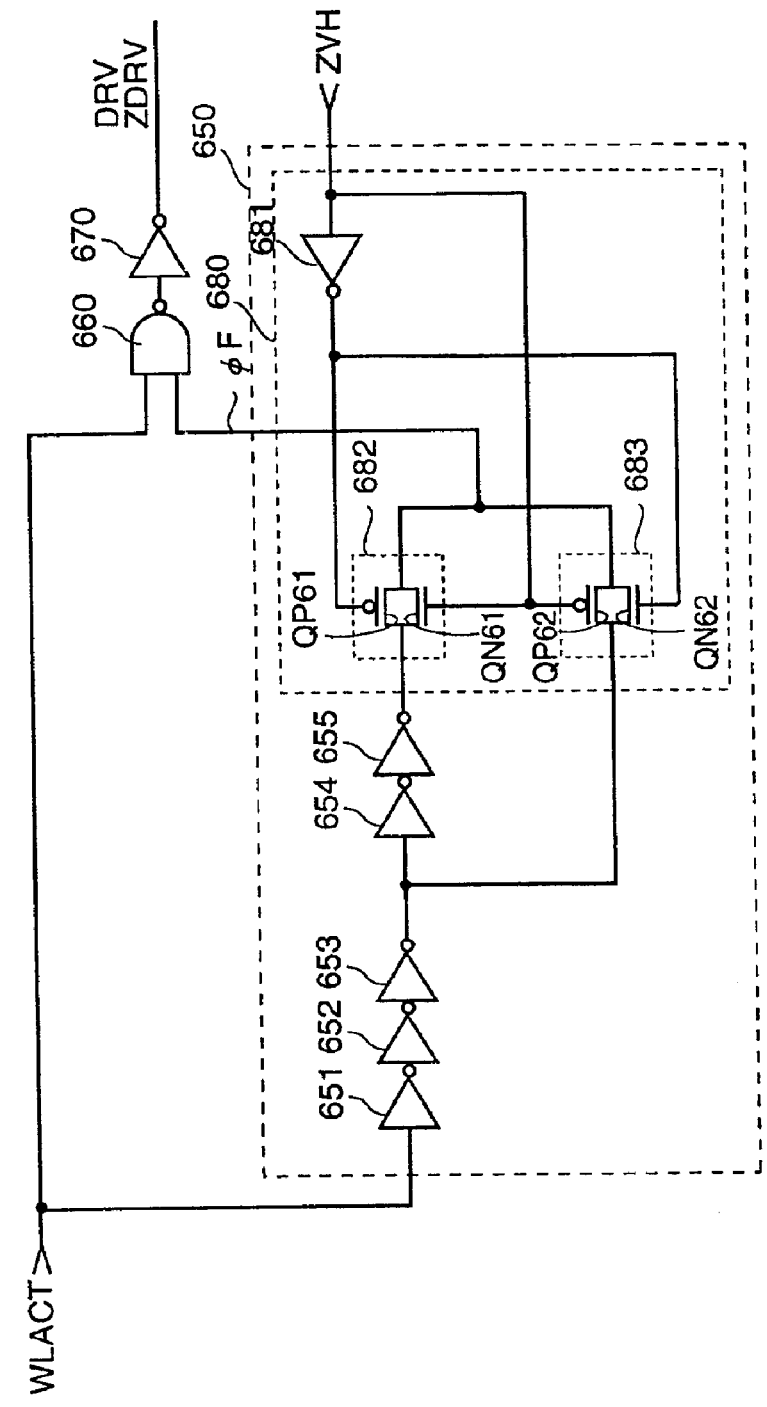
FIG. 19 is a circuit diagram showing a configuration of the internal power supply control circuit shown in FIG. 17.

FIG. 19 is a circuit diagram showing a configuration of the FIG. 17 internal power supply control circuit 115. As shown in FIG. 19, internal power supply control circuit 115 includes a delay circuit 650, a logic gate 660 and an inverter 670.

Delay circuit 650 delays word line activation signal WLACT and outputs it as a signal φF. Logic gate 660 outputs an AND of word line activation signal WLACT and signal φF. Inverter 670 inverts a signal received from logic gate 660 and the inverted signal is output as CCS control signal ZDRV to VDC100 and received by transistor QPa.

Delay circuit 650 includes inverters 651–655 connected in series and a switch stage 680 including transfer gates 682 and 683 and an inverter 681. Transfer gate 682 is configured by a P channel MOS transistor QP61 and an N channel MOS transistor QN61. Transfer gate 682 is connected between inverter 655 and logic gate 660. Transistor QP61 has a gate connected to inverter 681. Inverter 681 and the transistor QN61 gate receive signal ZVH output from external power supply level decision circuit 400. Transfer gate 683 is configured by P channel MOS transistor QP62 and N channel MOS transistor QN62. Transfer gate 683 is connected between inverter 653 and logic gate 660. Transistor Qn62 has a gate connected to inverter 681. Inverter 681 and the transistor QP62 gate receive signal ZVH output from external power supply level decision circuit 400.

Description will now be provided of an operation of VDC100 including CCS control circuit 110 configured as above.

Initially, if external power supply potential ext.Vdd is lower than a potential defined by a threshold value of transistors QN41–QN43 provided in external power supply level decision circuit 400, CCS control circuit 110 operates, as follows:

If external power supply potential ext.Vdd is lower than a potential defined by a threshold value of transistors QN41–QN43 provided in external power supply level decision circuit 400, transistors QN41–QN44 are turned off. Thus, node Nvh outputs signal ZVH having an inactive state (a high level).

Thus in internal power supply control circuit 115 at switch stage 680 transfer gate 682 turns on and transfer gate 683 turns off. As a result, delay circuit 650 outputs signal φF corresponding to a word line activation signal WLACT delayed by a total of the delay times of inverters 651–655 and also inverted. Thus, internal power supply control circuit 115 outputs CCS control signal ZDRV activated for the total of the delay times of inverters 651–655. While CCS control signal ZDRV is active, VDC100 supplies internal power supply node 90 with supply current Isup.

If external power supply potential ext.Vdd is higher than a potential defined by a threshold value of transistors QN41–QN43 provided in external power supply level decision circuit 400, CCS control circuit 110 operates, as follows:

If external power supply potential ext.Vdd is higher than a potential defined by a threshold value of transistors QN41–QN43 of external power supply level decision circuit 400, transistors QN41–QN44 turn on. Consequently, node Nvh outputs signal ZVH having an active state (a low level).

Thus in internal power supply control circuit 115 at switch stage 680 transfer gate 682 turns off and transfer gate 683 turns on. Consequently, delay circuit 650 outputs signal φF corresponding to a word line activation signal WLACT delayed by a total of the delay times of inverters 651–653 and also inverted. Thus, internal power supply control circuit 115 outputs CCS control signal ZDRV activated for the total of the delay times of inverters 651–653. In other words, if external power supply potential ext.Vdd is increased, CCS control signal ZDRV is activated for a reduced period of time and as a result VDC100 supplies internal power supply node 90 with current Isup for a reduced period of time. Thus, if external power supply potential ext.Vdd is increased, current Isup is not supplied to internal power supply node 90 excessively. Internal power supply potential int.Vdd can thus be stabilized.

Sixth Embodiment

As described in the fifth embodiment, external power supply level decision circuit 400 normally determines external power supply potential ext.Vdd and thus consumes a large amount of through current, and preferably, through current consumption should be minimized.

Figure 20:
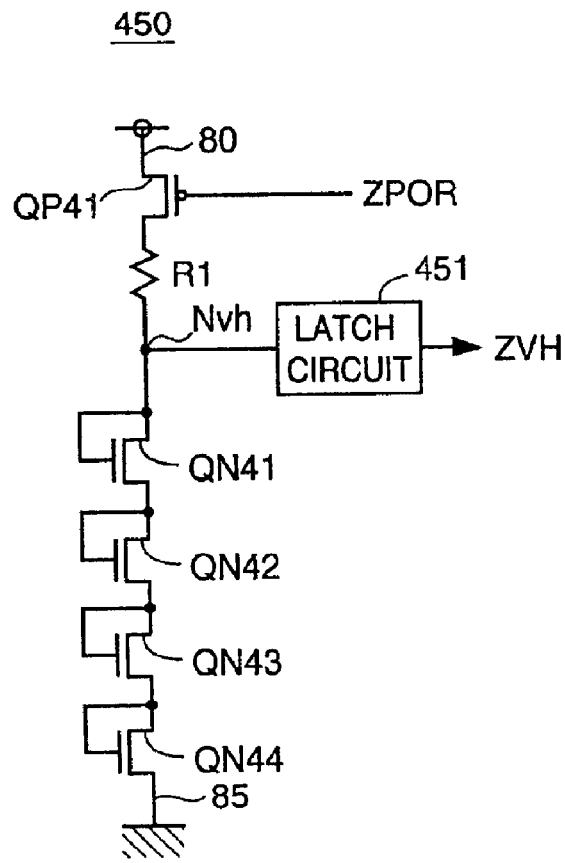
FIG. 20 is a circuit diagram showing a configuration of an external power supply level decision circuit of a sixth embodiment of the present invention.

FIG. 20 is a circuit diagram showing a configuration of an external power supply level decision circuit of a sixth embodiment.

As shown in FIG. 20, an external power supply level decision circuit 450 includes a resistor R1, transistors QN41–QN44, a P channel MOS transistor QP41, and a latch circuit 451. Transistor QP41 is connected between external power supply node 80 and resistor R1. Transistor QP41 has a gate receiving a power on reset signal ZPOR generated by control circuit 20 and activated for a predetermined period of time after semiconductor integrated circuit device 1 is powered on. Latch circuit 451 latches signal ZVH output from node Nvh.

The remainder of the circuit configuration is identical to the FIG. 18 external power supply level decision circuit 400.

VDC100 including thus-configured external power supply level decision circuit 450, operates, as follows:

When semiconductor integrated circuit device 1 is powered on, power on reset signal ZPOR is activated (driven low). Thus in external power supply level decision circuit 450 transistor QP41 turns on. Thus external power supply level decision circuit 450 determines external power supply potential ext.Vdd. Note that the decision is stored in latch circuit 451. Power on reset signal ZPOR is only activated for a predetermined period of time. When the predetermined period of time elapses, power on reset signal ZPOR is inactivated. With power on reset signal ZPOR thus inactivated, however, signal ZVH output is still maintained in response to the decision stored in latch circuit 451.

Thus the external power supply level decision circuit determines external power supply potential ext.Vdd for a determined period of time and thus prevents the internal power supply node from excessively receiving current. Furthermore, the external power supply level decision circuit can reduce through current flowing therethrough.

Seventh Embodiment

Figure 21:
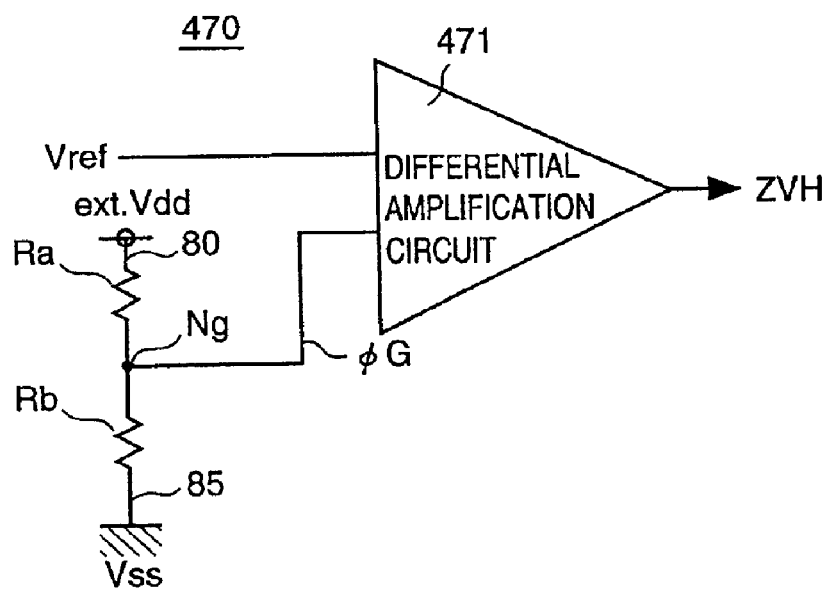
FIG. 21 is a circuit diagram showing a configuration of an external power supply level decision circuit of a seventh embodiment.

FIG. 21 is a circuit diagram showing a configuration of an external power supply level decision circuit of a seventh embodiment.

As shown in FIG. 21, an external power supply level decision circuit 470 includes resistors Ra and Rb connected in series between external power supply node 80 and ground node 85, and a differential amplification circuit 471.

External power supply potential ext.Vdd is divided in resistance by resistors Ra and Rb. Resistors Ra and Rb are connected by a node Ng, which outputs a signal φG to differential amplification circuit 471. Signal φG has a potential obtain by dividing external power supply potential ext.Vdd in resistance.

Differential amplification circuit 471 receives signal φG and reference potential Vref generated internal to semiconductor integrated circuit device 1, to compare them and output the result as decision signal ZVH. If signal φG is higher than reference potential Vref, decision signal ZVH is activated (driven low). If signal φG is lower than reference potential Vref, decision signal ZVH is inactivated (driven high). Note that differential amplification circuit 471 has the same circuit configuration as the FIG. 29 differential amplification circuit 530.

Decision signal ZVH output from differential amplification circuit 471 is input to VDC100 and received by transistor QPa at the gate.

External power supply level decision circuit 470 has resistors Ra and Rb set so that signal φG when external power supply potential ext.Vdd is equal to that of reference potential Vref.

VDC100 including thus-configured external power supply level decision circuit 470, operates, as follows:

If external power supply potential ext.Vdd increases, signal φG has a potential increasing to be higher than reference potential Vref. Thus differential amplification circuit 471 outputs decision signal ZVH activated. The operations subsequent thereto are identical to those described in the fifth embodiment.

Thus, even if external power supply potential ext.Vdd varies and its level in potential increases, the VDC does not supply the internal power supply node with excessive current.

Eighth Embodiment

Figure 22:
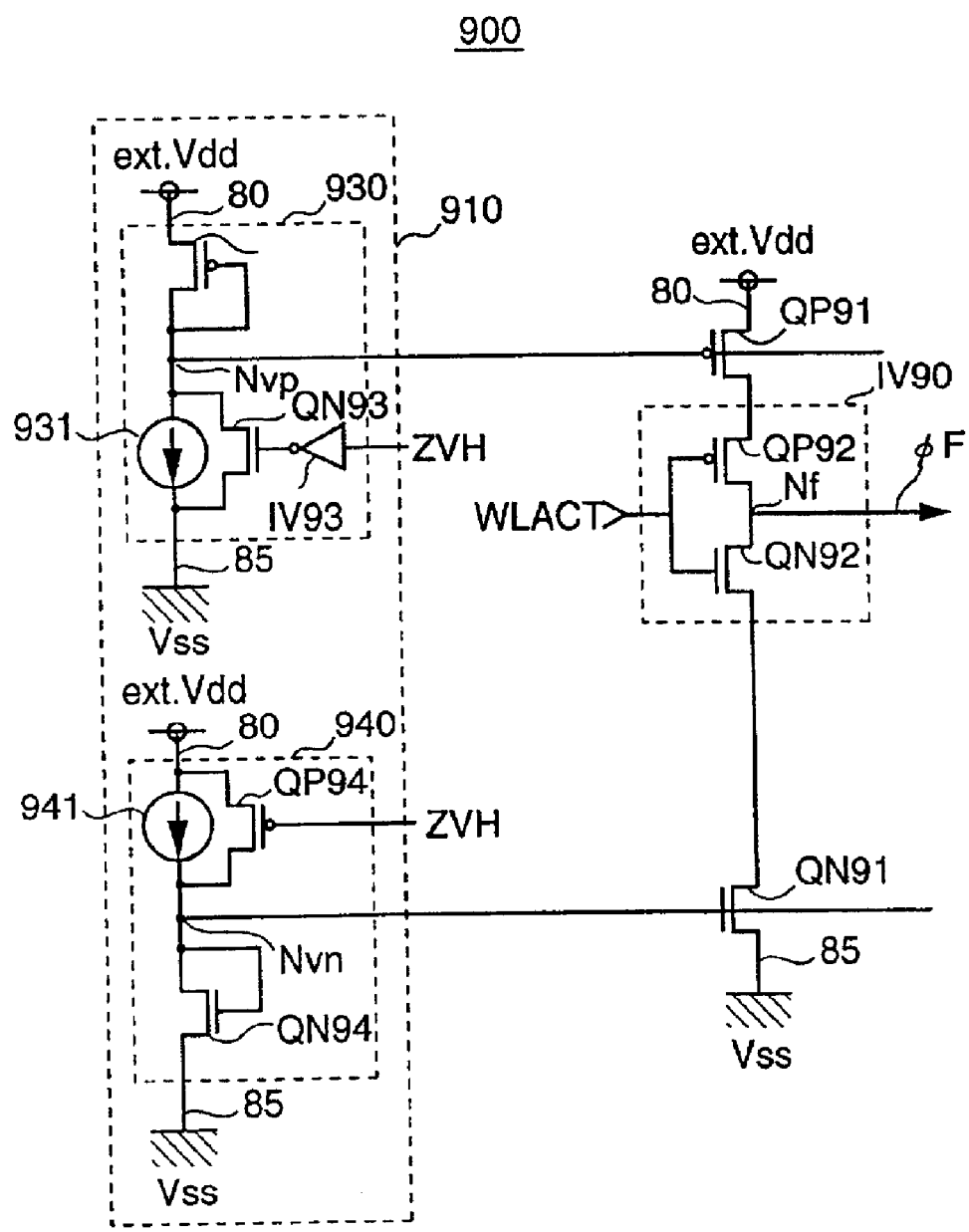
FIG. 22 is a circuit diagram showing a configuration of a delay circuit provided in an internal power supply control circuit of an eighth embodiment.

FIG. 22 is a circuit diagram showing a configuration of a delay circuit provided in an internal power supply control circuit of an eighth embodiment.

As shown in FIG. 22, a delay circuit 900 includes an inverter IV90, a P channel MOS transistor QP91, an N channel MOS transistor QN91 and a delay time adjustment circuit 910.

Delay time adjustment circuit 910 includes a first adjustment circuit 930 adjusting a level in potential of a gate of P channel MOS transistor QP91, and a second adjustment circuit 940 adjusting a level in potential of a gate of N channel MOS transistor QN91.

The first adjustment circuit 930 includes a P channel MOS transistor QP93, an N channel MOS transistor QN 93, a source of constant current 931, and an inverter IV93. Transistor QP93 and the source of constant current 931 are connected in series between external power supply node 80 and ground node 85. Transistor QP93 has a source connected to external power supply node 80 and a gate diode-connected. Transistor QN93 is connected in parallel with the source of constant current 931. Transistor QN93 has a gate connected to inverter IV93 and receiving an inverted version of signal ZVH. The first adjustment circuit 930 is connected by a node Nvp to transistor QP91 at the gate.

Thus transistors QP93 and QP91 form a current mirror.

The second adjustment circuit 940 includes a P channel MOS transistor QP94, an N channel MOS transistor QN94 and a source of constant current 941. The source of constant current 941 and transistor QN94 are connected in series between external power supply node 80 and ground node 85. Transistor QN94 has a source connected to ground node 85 and a gate diode-connected. Transistor QP94 is connected in parallel with the source of constant current 941. Transistor QN94 has a gate receiving signal ZVH. The second adjustment circuit 930 is connected by a node Nvn to transistor QN91 at the gate.

Thus transistors QN94 and QN91 form a current mirror.

Inverter IV90 is configured of a P channel MOS transistor QP92 and an N channel MOS transistor QN92. Transistors QP92 and QN92 have their respective gates receiving word line activation signals WLACT. Inverter IV90 outputs a signal φF at a node Nf connecting transistors QP92 and QN92 together.

Transistor QP91 is connected between external power supply node 80 and transistor QP92. Transistor QP91 has a gate receiving a signal output from the first adjustment circuit 930.

Transistor QN91 is connected between transistor QN92 and ground node 85. Transistor QN 91 has a gate receiving a signal output from the second adjustment circuit 940.

Internal power supply control circuit 115 including thus-configured delay circuit 900, operates, as follows:

Initially, if external power supply potential ext.Vdd has a constant value and thus does not exceed a predetermined value, external power supply level decision circuit 400 outputs signal ZVH having a high level.

When signal ZVH is input to the first adjustment circuit 930 and received by inverter IV93, transistor QN93 turns off. Thus in the first adjustment circuit 930 electric current flows through transistor QP93 and the source of constant current 931. This electric current will be labeled I1. Since transistors QP93 and QP91 form a current mirror, if transistor QP93 passes current I1 then transistor QP91 also passes current I1.

When external power supply potential ext.Vdd is increased, external power supply level decision circuit 400 outputs signal DVH having a low level.

Thus when signal ZVH is input to inverter IV93 transistor QN93 turns on. Thus in the first adjustment circuit 930 electric current flows through transistors QP93 and QN93. This current, represented by I2, is larger in amount than current I1.

Since transistors QP93 and QP91 form a current mirror, if transistor Qp93 passes current I2 then transistor Qp91 also passes an increased amount of current.

Thus, when signal ZVH is driven from high to low and thus activated. i.e., external power supply potential ext.Vdd has increased, transistor QP91 passes increased current. This results in a reduced delay time for a signal input to transistor IV90.

The operation of the second adjustment circuit 940 is similar to that of the first adjustment circuit 930.

If external power supply level decision circuit 400 outputs signal ZVH having a high level, in the second adjustment circuit 940 transistor QP94 turns off. Thus in the second adjustment circuit 940 electric current flows through the source of constant current 941 and transistor QN94. This current will be leveled I3. Since transistors QN94 and QN91 form a current mirror, if transistor QN94 passes current I3 then transistor QN91 also passes current I3.

Then when signal ZVH attains a low level transistor QP94 turns on and thus in the second adjustment circuit 940 electric current flows through transistors QP94 and QN94. This current, represented by I4, is greater in amount than current I3.

Since transistors QN94 and QN91 form a current mirror, if transistor QN94 passes current I4 then transistor QP91 also passes an increased amount of current.

Thus, when signal ZVH transitions from high to low and is thus activated, i.e., external power supply potential ext.Vdd increases, transistor QN91 passes increased current. This results in a reduced delay time for a signal input to transistor IV90.

Thus in the internal power supply control circuit the delay circuit can adjust a delay time by adjusting an amount of current flowing through an inverter which determines a delay time for an output signal.

Ninth Embodiment

If semiconductor integrated circuit device 1 is testable for example by a burn-in test, operating the current supply transistor in the burn-in test and thus supplying the internal power supply node with supply current Isup may overcharge the internal power supply node.

Thus it is desirable that the operation of the current supply transistor to supply current Isup be stopped in the test.

Figure 23:
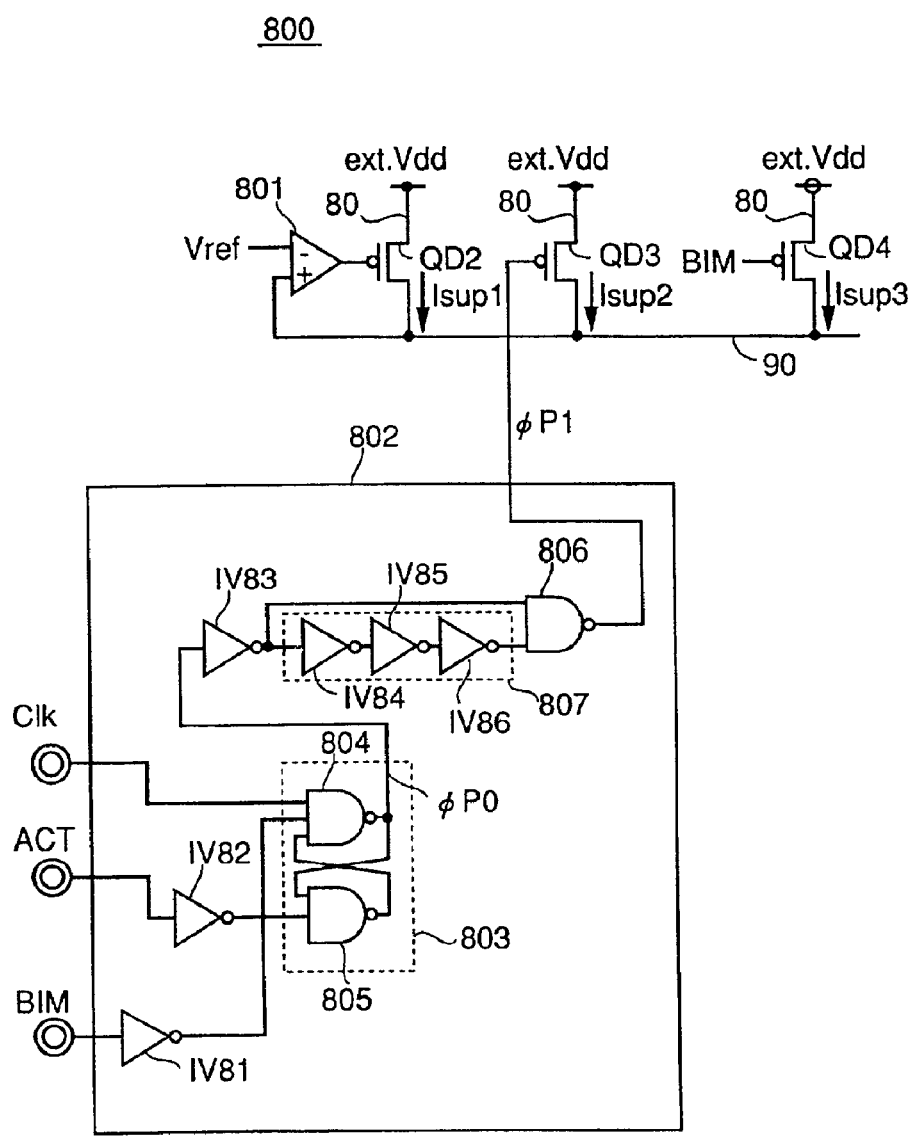
FIG. 23 is a circuit diagram showing a configuration of a VDC of a ninth embodiment.

FIG. 23 is a circuit diagram showing a configuration of a VDC of a ninth embodiment.

As shown in FIG. 23, a VDC 800 includes a differential amplification circuit 801, a pulse generation circuit 802 and current supply transistors QD2–QD4.

Differential amplification circuit 801 receives reference potential Vref and internal power supply potential int.Vdd, compares the potentials and transmits the result to current supply transistor QD2 at the gate. If the result has a potential of a low level, current supply transistor QD2 passes current Isup1 from external power supply node 80 to internal power supply node 90.

Current supply transistor QD3 is connected between external power supply node 80 and internal power supply node 90. Transistor QD3 has a gate receiving a signal φP1 output from pulse generation circuit 802 and when signal φP1 has an active state (a low level) transistor QD3 passes current Isup2 from external power supply node 80 to internal power supply node 90.

Current supply transistor QD4 is connected between external power supply node 80 and internal power supply node 90. Transistor QD4 has a gate receiving a burn-in signal BIM externally input and activated in a burn-in test, and when burn-in signal BIM has an active state (a high level) transistor DQ4 passes current Isup3 from external power supply node 80 to internal power supply node 90.

Pulse generation circuit 802 outputs signal φP1 provided to turn on current supply transistor QD3. Signal φP1 is only activated for a period of time in which the current consumption on internal power supply node 90 is greatest.

Pulse generation circuit 802 includes inverters IV80–IV83, a flip-flop 803, a delay circuit 807 and a logic gate 806.

Flip-flop 803 includes logic gates 804 and 805. When the semiconductor integrated circuit device operates in a normal mode and it does not conduct a test such as burn-in, flip-flop 803 receives control signal ACT that is inverted by inverter IV82, as a set input, and receives a clock signal CLK as a reset input.

Logic gate 804 receives burn-in signal BIM that is inverted by inverter IV81.

Flip-flop 803 outputs a signal φP0, which is in turn input to inverter 83. Inverter 83 inverts signal φP0 and thus outputs it.

Delay circuit 807 includes inverters IV84–IV86 connected in series. Delay circuit 807 delays for a time Δτ a signal received from inverter IV83 and also inverts the signal in level for output.

Logic gate 806 receives a signal output from inverter IV83 and a signal output from delay circuit 807 and outputs an NAND of the signals as signal φP1.

Figure 24:
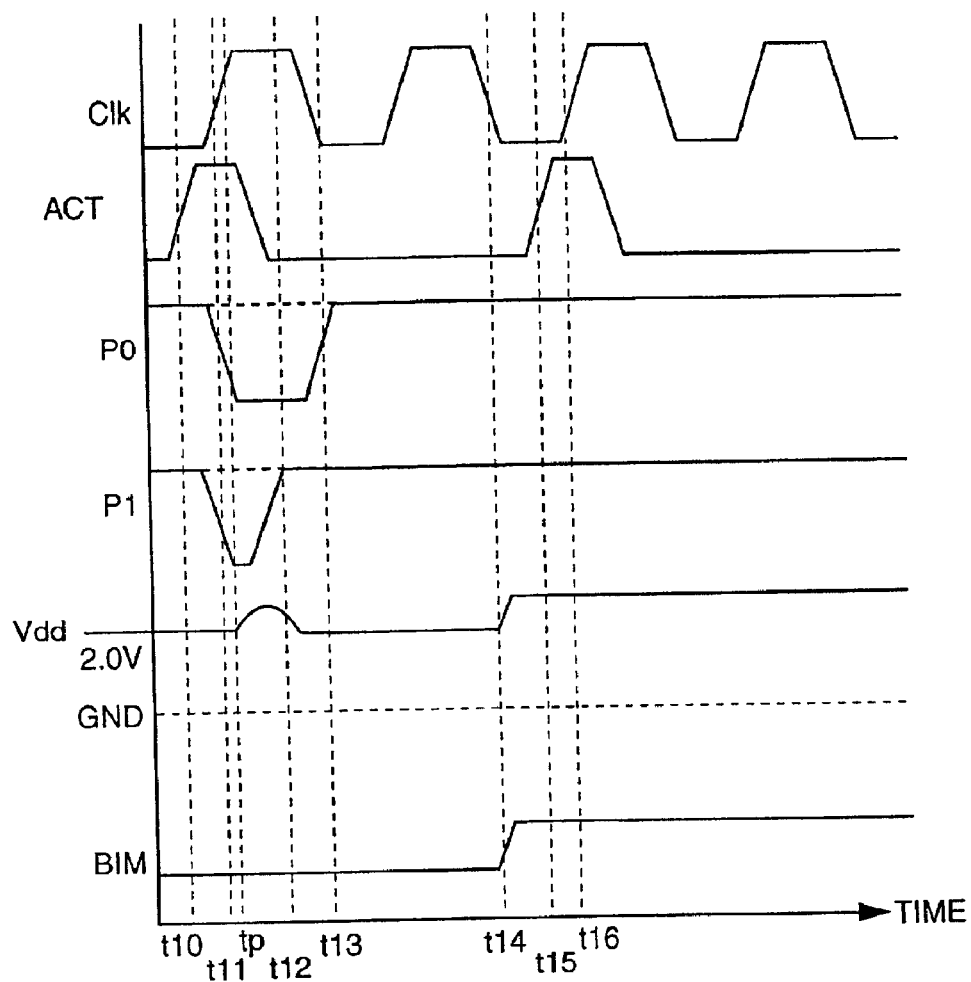
FIG. 24 is timing plots representing an operation of a VDC.

VDC800 thus configured operates, as follows:

FIG. 24 is a timing plots representing an operation of VDC800.

When semiconductor integrated circuit device 1 operates in a normal mode, VDC800 operates, as described below:

With reference to FIG. 24, when semiconductor integrated circuit device 1 operates in the normal mode, burn-in signal BIM has an active state. Thus, current supply transistor QD4 turns off. Consequently, current supply transistor QD4 does not pass current Isup3.

At time t10 control signal ACT is activated (driven high) and clock signal CLK at time t11 goes high, when flip-flop 803 outputs signal φP0 activated (driven low). Thus logic gate 806 outputs signal φP1 activated (driven level) from time t11 through delay time period Δτ determined by delay circuit 807 to time t12. Thus, current supply transistor QD3 turns on from time t11 through time t12 to pass current Isup2 to internal power supply node 90. Thus in semiconductor integrated circuit device 1 after control signal ACT is activated and before sense amplifier SA or the like operates, VDC800 supplies internal power supply node 90 with current Isup2 compulsorily. This can prevent internal power supply node 90 from having a level in potential reducing while sense amplifier SA or the like is in operation. Note that signal P0 is inactivated (or driven high) when clock signal CLK rises, i.e., at time t13. Furthermore, when with sense amplifier SA in operation, internal power supply node 90 has a level dropping in potential, then in VDC800 differential amplification circuit 801 operates and via current supply transistor QD2 current Isup1 is supplied.

Thus in the normal mode pulse generation circuit 802 outputs signal φP1 that is active for a predetermined period of time and transistor QD3 allows current to be supplied.

In contrast, if semiconductor integrated circuit device 1 operates in a burn-in test mode, at time t14 burn-in signal BIM is activated (driven high), and current supply transistor QD4 turns on and internal power supply node 90 has a potential level increasing for the burn-in test.

Meanwhile in pulse generation circuit 802 at flip-flop 803 logic gate 804 receives a low-level signal from inverter IV81. As a result, at time t15 control signal ACT is activated and in spite that at time t16 clock signal CLK attains a high level signal φP0 still maintains an inactive state (a high level). Consequently, signal φP1 also attains an inactive state (a high level) and current supply transistor QD3 remains off.

Thus in a burn-in test transistor QD4 turning on to supply current allows internal power supply node 90 to have a level in potential increasing for the burn-in test while transistor QD3 does not operate to supply current. Thus, internal power supply node 90 can be prevented from having an unnecessarily high level in potential.

Tenth Embodiment

Figure 25:
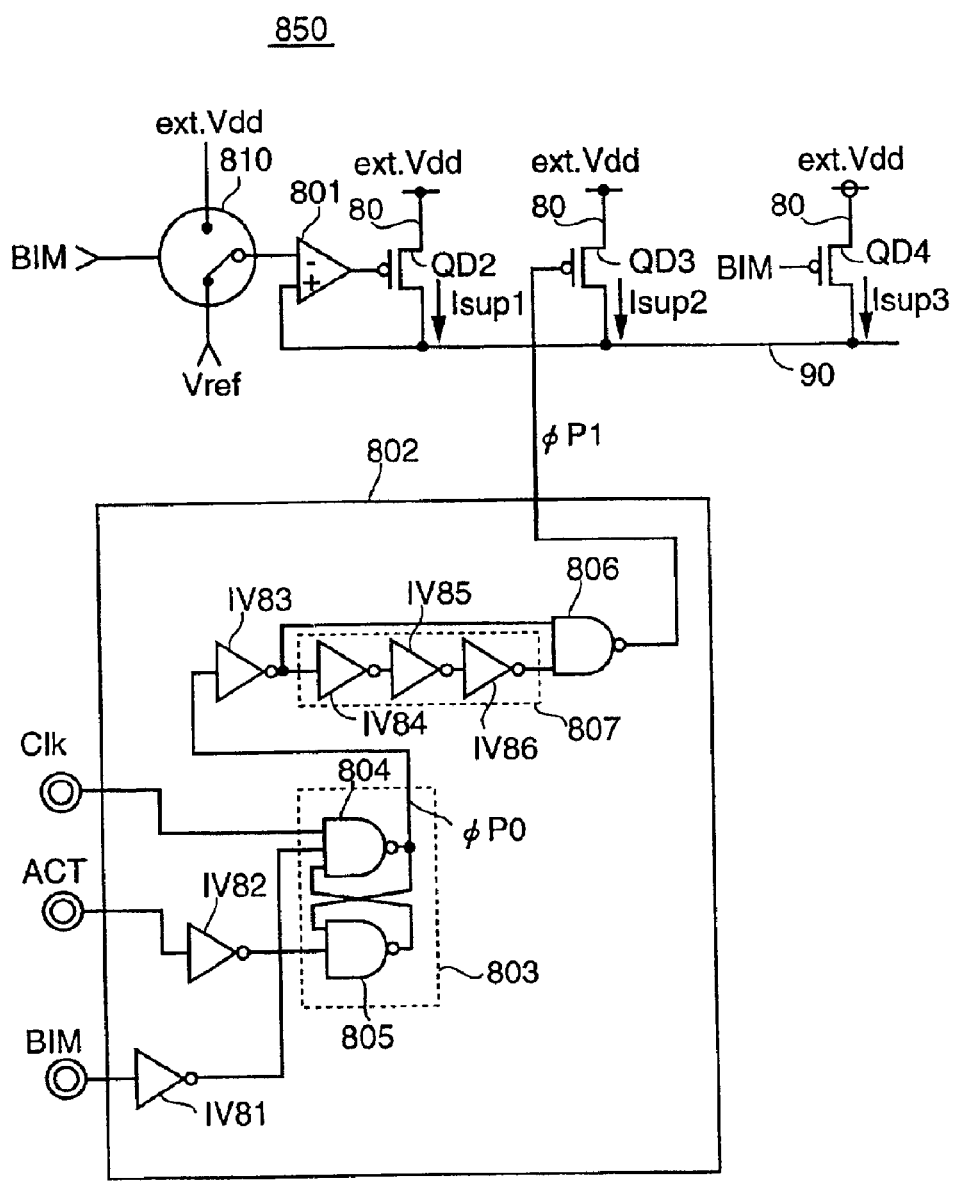
FIG. 25 is a circuit diagram showing a configuration of a VDC of a tenth embodiment.

FIG. 25 is a circuit diagram showing a configuration of a VDC of a tenth embodiment.

As shown in FIG. 25, a VDC850, as compared with VDC800, further includes a switch circuit 810.

When burn-in signal BIM has an inactive state (a low level), switch circuit 810 passes reference potential Vref to differential amplification circuit 801. When burn-in signal BIM has an active state (a high level), switch circuit 810 passes external power supply potential ext.Vdd to differential amplification circuit 801.

The remainder of the circuit configuration is identical to that of VDC800.

Figure 26:
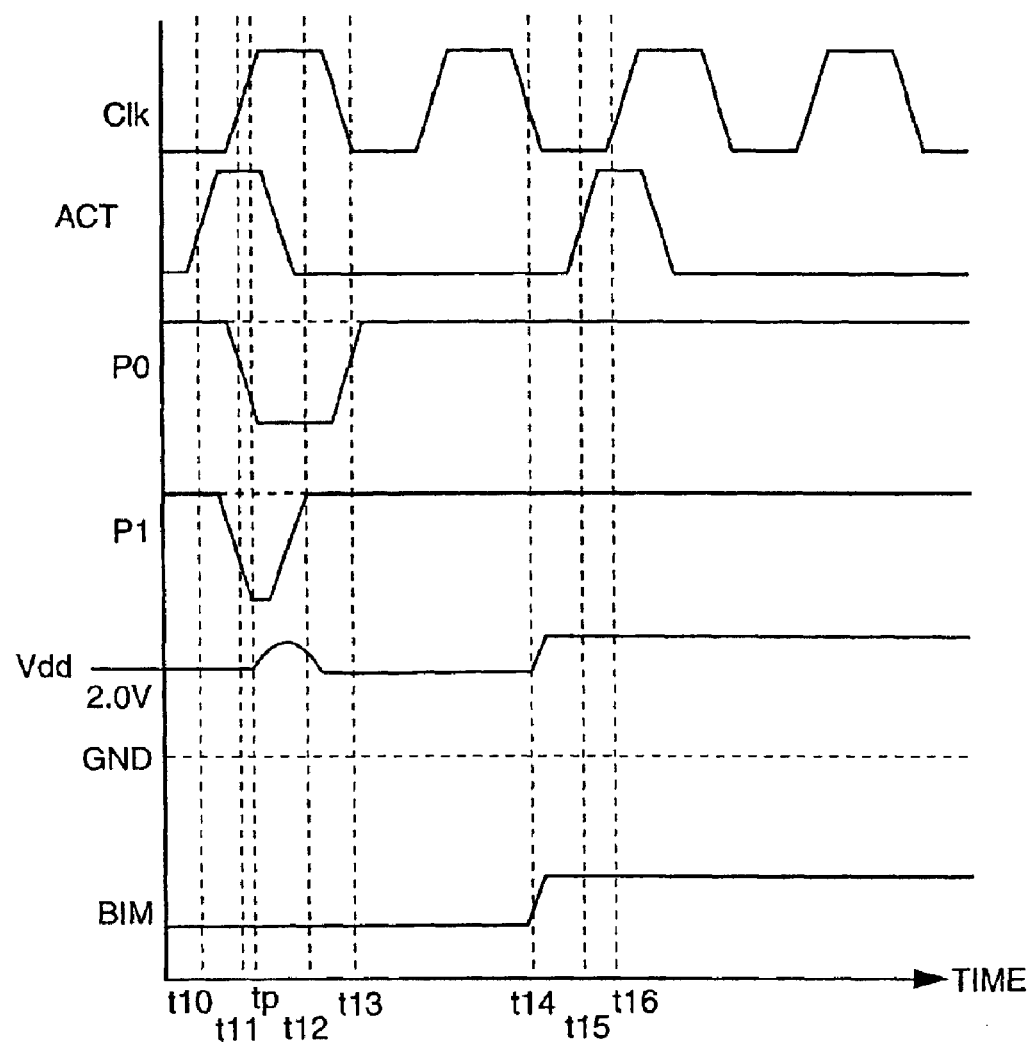
FIG. 26 is timing plots representing an operation of a VDC.

VDC850 thus configured operates, as follows:

FIG. 26 is timing plots representing an operation of VDC850.

With reference to FIG. 26, when the semiconductor integrated circuit device operates in a normal mode, the operation from time t10 through time t13 is identical to that shown in FIG. 24.

At time t14 a burn-in test mode is set in the semiconductor integrated circuit device, when burn-in signal BIM is activated.

Furthermore, at time t14 when burn-in signal BIM is activated, switch circuit 810 passes external power supply potential ext.Vdd to differential amplification circuit 801. Thus throughout the burn-in test internal power supply node 90 has a level in potential stabilized, or external power supply potential ext.Vdd.

Thus in a burn-in test mode, current supply transistor QD3 is stopped from passing current. Furthermore in the VDC the differential amplification circuit receives reference potential Vref switched to external power supply potential ext.Vdd to allow internal power supply node 90 to have a level in potential stabilized to be external power supply potential ext.Vdd. Thus, if current supply transistor QD3 operates the internal power supply node can be prevented from having a level in potential unnecessarily increased.

Eleventh Embodiment

Figure 27:
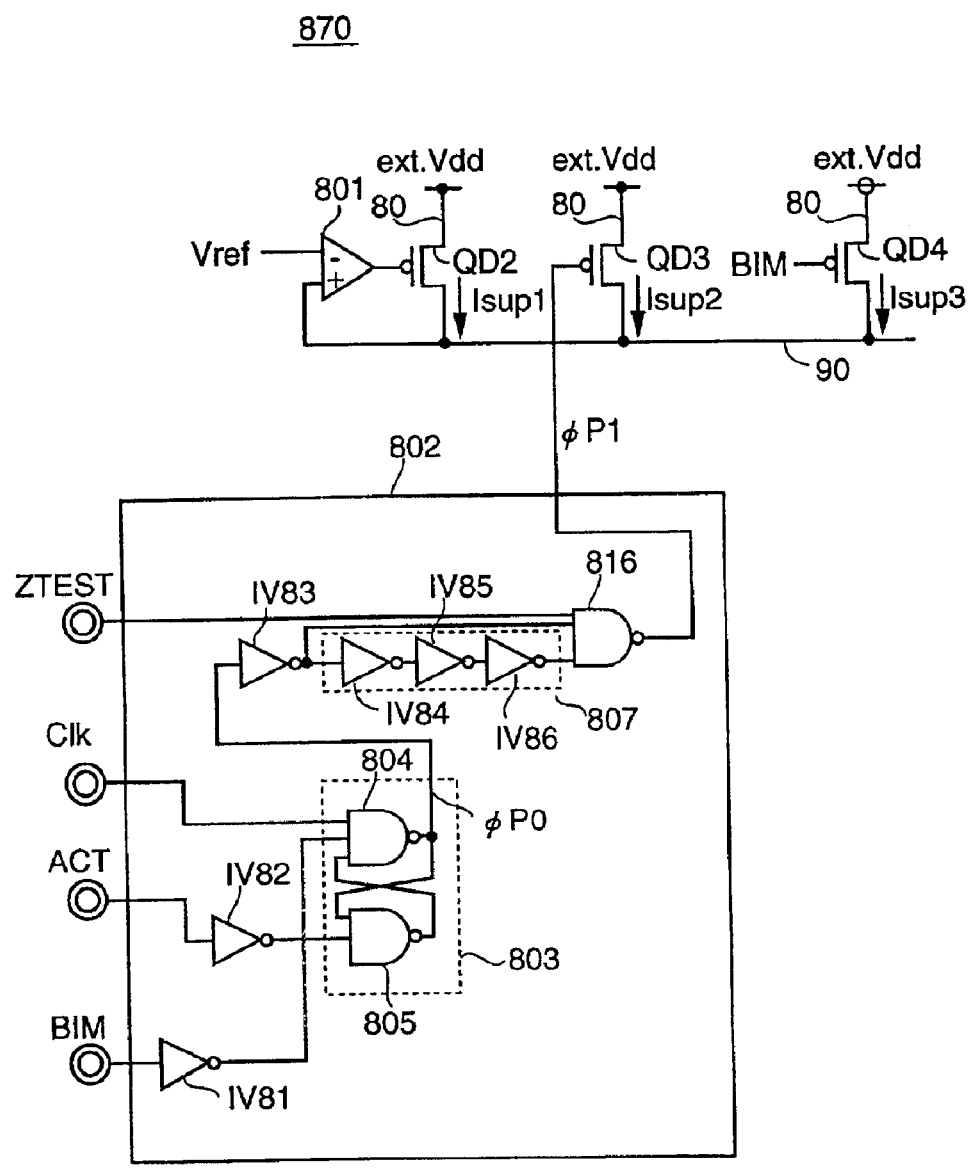
FIG. 27 is a circuit diagram showing a configuration of a VDC of an eleventh embodiment.

FIG. 27 is a circuit diagram showing a configuration of a VDC of an eleventh embodiment.

As shown in FIG. 27, a VDC870, as compared with VDC800, includes in pulse generation circuit 802 a logic gate 816 in place of logic gate 806.

Logic gate 816 receives a signal output from inverter IV83, a signal output from delay circuit 807 and an externally input test signal ZTEST, provides a logical product of the signals, inverts the logical product and output it as signal φP1.

Test signal ZTEST is a signal externally input and activated (driven low) when a test mode is selected in the semiconductor integrated circuit device of interest.

The remainder of the circuit configuration is the same as shown in FIG. 23.

Figure 28:
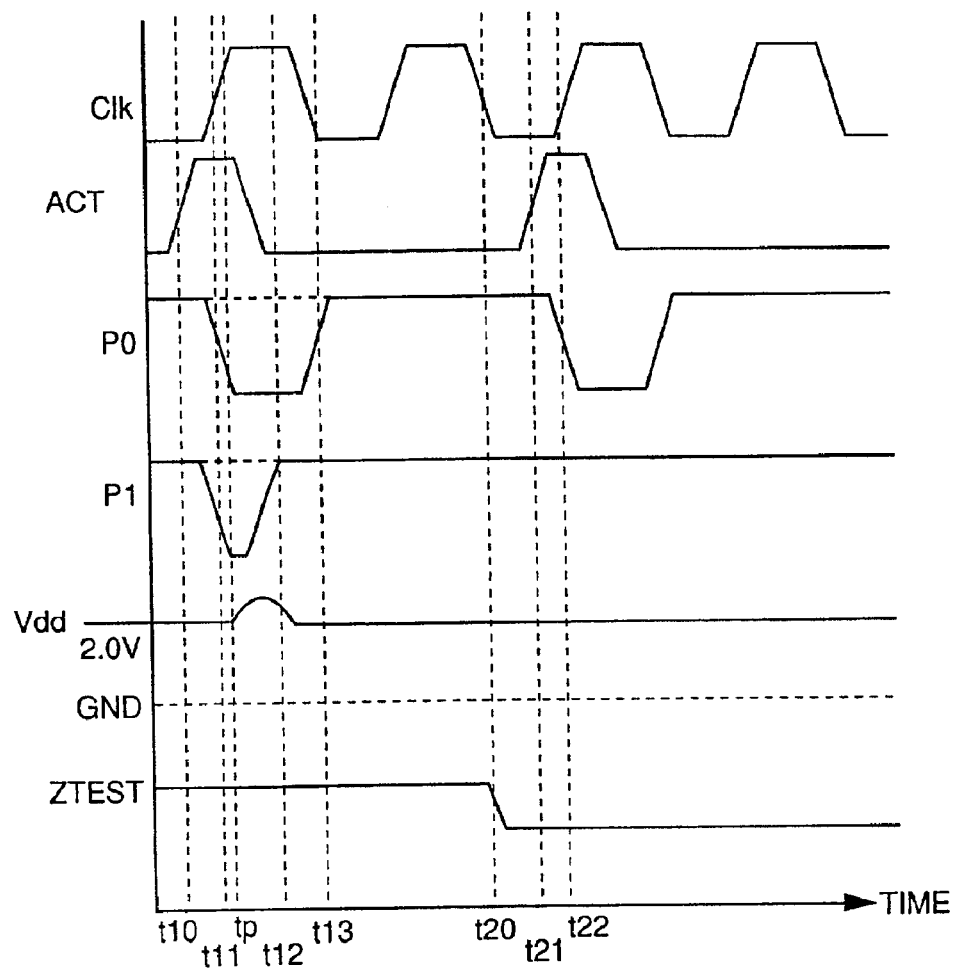
FIG. 28 is timing plots representing an operation of a VDC.

VDC870 thus configured as operates, as follows:

FIG. 28 is timing plots representing an operation of VDC870.

With reference to FIG. 28, when the semiconductor integrated circuit device operates in a normal mode, the operation from time t10 through time t13 is provided as shown in FIG. 24.

At time t20 the test mode is set in the semiconductor integrated circuit device and test signal ZTEST is responsively activated (driven low).

Thus from time t20 on in pulse generation circuit 802 logic gate 816 outputs signal φP1 constantly having an inactive state (a high level). Thus if at time t21 control signal ACT is activated and at time t22 clock signal CLK attains a high level and as a result signal φP0 is activated, signal φP1 still constantly has the inactive state. Thus from time t20 on current supply transistor QD3 is turned off and in the test mode internal power supply node 90 does not receive current Isup2 via transistor QD3. Note that the operation provided when burn-in signal BIM is input is the same as described in the ninth embodiment.

Thus VDC870 when the test mode is set in the semiconductor integrated circuit device facilitates an operation margin test.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device comprising:
   a load circuit effecting an operation in response to a control signal activated;
   an internal power supply node connected to said load circuit;
   an external power supply node supplying an external power supply potential;
   an internal power supply generation circuit converting said external power supply potential to an internal power supply potential for supply to said internal power supply node; and
   an overcharge prevention circuit preventing said internal power supply node from being overcharged;
   wherein said internal power supply generation circuit includes:
      a first differential amplification circuit amplifying a potential difference between said internal power supply potential input to a first differential input node and a reference potential input to a second differential input node, for output to an output node;
      a current supply circuit supplying said internal power supply node with a current depending on a potential of said output node; and
      a compulsory current supply circuit passing a current from said external power supply node to said input power supply node regardless of said potential difference.

2. The semiconductor integrated circuit device according to claim 1, wherein said compulsory current supply circuit supplies a current to said internal power supply node for a predetermined period of time in response to said control signal activated.

3. The semiconductor integrated circuit device according to claim 2, wherein said overcharge prevention circuit reduces said internal power supply potential when said internal power supply potential is higher than a predetermined potential.

4. The semiconductor integrated circuit device according to claim 3, wherein said overcharge prevention circuit includes:
   a second differential amplification circuit comparing said internal power supply potential with said predetermined potential and outputting a result of comparing said internal power supply potential with said predetermined potential; and
   a potential reduction circuit reducing said internal power supply potential in response to said result.

5. The semiconductor integrated circuit device according to claim 4, wherein said predetermined potential is higher than said reference potential.

6. The semiconductor integrated circuit device according to claim 2, further comprising a decouple capacitance connected to said internal power supply node, wherein said predetermined period of time determined by said compulsory current supply circuit depends on a size of said decouple capacitance.

7. The semiconductor integrated circuit device according to claim 2, wherein:
   said load circuit includes a memory cell array having a plurality of memory cells; and
   said predetermined period of time determined by said compulsory current supply circuit depends on a size in memory of said memory cell array.

8. The semiconductor integrated circuit device according to claim 2, further comprising a decouple capacitance connected to said internal power supply node, wherein said internal power supply generation circuit includes more than one said compulsory current supply circuit and determines from a size of said decouple capacitance how many of said more than one compulsory current supply circuit should be activated.

9. The semiconductor integrated circuit device according to claim 2, wherein:
   said load circuit includes a memory cell array having a plurality of memory cells; and
   said internal power supply generation circuit includes more than one said compulsory current supply circuit and determines from a size in memory of said memory cell array how many of said more than one compulsory current supply circuit should be activated.

10. The semiconductor integrated circuit device according to claim 2, wherein:
    said overcharge prevention circuit includes a decision circuit making a decision as to whether said external power supply potential is higher than a predetermined potential, and outputting a decision signal activated for said external power supply potential higher than said predetermined potential; and
    said compulsory current supply circuit includes a period decision circuit determining said predetermined period of time in response to said decision signal.

11. The semiconductor integrated circuit device according to claim 10, wherein said decision circuit makes said decision when a decision start signal externally input has an active state.

12. The semiconductor integrated circuit device according to claim 10, wherein said predetermined potential is said reference potential.

13. The semiconductor integrated circuit device according to claim 10, wherein said period decision circuit includes a delay circuit having a plurality of inverters and is operative in response to said decision signal to determine a number of said inverters to be operated.

14. The semiconductor integrated circuit device according to claim 10, wherein:
    said period decision circuit includes a delay circuit having an inverter and a transistor element provided to adjust a current flowing through said inverter, said transistor element having a control electrode receiving a potential provided in response to said decision signal.

15. The semiconductor integrated circuit device according to claim 2, wherein said overcharge prevention circuit invalidates a function of said compulsory current supply circuit when an external signal is activated.

16. The semiconductor integrated circuit device according to claim 15, having a test mode, wherein said external signal is activated in said test mode.

17. The semiconductor integrated circuit device according to claim 15, capable of conducting a burn-in test, said external signal is activated when said burn-in test is conducted.

18. The semiconductor integrated circuit device according to claim 2, wherein said overcharge prevention circuit in said test mode sets as said external power supply potential said reference potential input to said second differential amplification node of said first differential amplification circuit.

* * * * *